(12) United States Patent
Cheng

(10) Patent No.: US 11,653,581 B2
(45) Date of Patent: May 16, 2023

(54) RRAM DEVICE STRUCTURE AND MANUFACTURING METHOD

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 193 days.

(21) Appl. No.: 17/193,843

(22) Filed: Mar. 5, 2021

(65) Prior Publication Data

US 2022/0052258 A1 Feb. 17, 2022

Related U.S. Application Data

(60) Provisional application No. 63/065,367, filed on Aug. 13, 2020.

(51) Int. Cl.
| | | |
|---|---|---|
| *H01L 45/00* | (2006.01) | |
| *H01L 27/24* | (2006.01) | |
| *G11C 13/00* | (2006.01) | |

(52) U.S. Cl.
CPC ...... *H01L 45/1253* (2013.01); *H01L 27/2436* (2013.01); *H01L 45/1233* (2013.01); *H01L 45/1608* (2013.01); *H01L 45/1666* (2013.01); *G11C 13/003* (2013.01); *G11C 2213/79* (2013.01)

(58) Field of Classification Search
CPC ...................................................... H01L 45/00
See application file for complete search history.

(56) References Cited

U.S. PATENT DOCUMENTS

| | | | |
|---|---|---|---|
| 8,188,569 | B2 | 5/2012 | Seidl |
| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 2008/0006883 | A1 | 1/2008 | Mori |
| 2012/0138886 | A1 | 6/2012 | Kuhn et al. |
| 2012/0319072 | A1 | 12/2012 | Wei et al. |
| 2014/0152377 | A1 | 6/2014 | Spanier et al. |
| 2015/0262663 | A1 | 9/2015 | Lee et al. |
| 2019/0326288 | A1 | 10/2019 | Hashemi et al. |

(Continued)

FOREIGN PATENT DOCUMENTS

| | | |
|---|---|---|
| CN | 102859690 A | 1/2013 |
| CN | 105923602 A | 9/2016 |

(Continued)

*Primary Examiner* — Marvin Payen
(74) *Attorney, Agent, or Firm* — Seed IP Law Group

(57) ABSTRACT

A resistive random access memory cell includes a gate all around transistor and a resistor device. The resistor device includes a first electrode including a plurality of conductive nanosheets. The resistor device includes a high-K resistive element surrounds the conductive nanosheets. The resistor device includes a second electrode separated from the conductive nanosheets by the resistive element.

20 Claims, 20 Drawing Sheets

(56) References Cited

U.S. PATENT DOCUMENTS

2020/0135929 A1    4/2020   Van Dal et al.
2020/0176032 A1    6/2020   Chiang et al.

FOREIGN PATENT DOCUMENTS

| | | |
|---|---|---|
| JP | 2008172218 A | 7/2008 |
| KR | 20190071074 A | 6/2019 |
| KR | 20200050422 A | 5/2020 |
| KR | 20200066548 A | 6/2020 |
| TW | 201131745 A1 | 9/2011 |
| TW | 202025498 A | 7/2020 |
| WO | WO 2011105060 A1 | 9/2011 |

RRAM DEVICE STRUCTURE AND MANUFACTURING METHOD

BACKGROUND

Technical Field

The present disclosure relates to the field of integrated circuits. The present disclosure relates more particularly to resistive random access memory cells.

Description of the Related Art

There has been a continuous demand for increasing computing power in electronic devices including smart phones, tablets, desktop computers, laptop computers and many other kinds of electronic devices. Integrated circuits often include memory arrays. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, these techniques also face serious difficulties in ensuring that the features are properly formed.

Many integrated circuits include memory arrays. The reduction in the size of integrated circuit features extends to the memory cells of the memory arrays. However, it can be difficult to form effective memory cells at smaller and smaller technology nodes.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
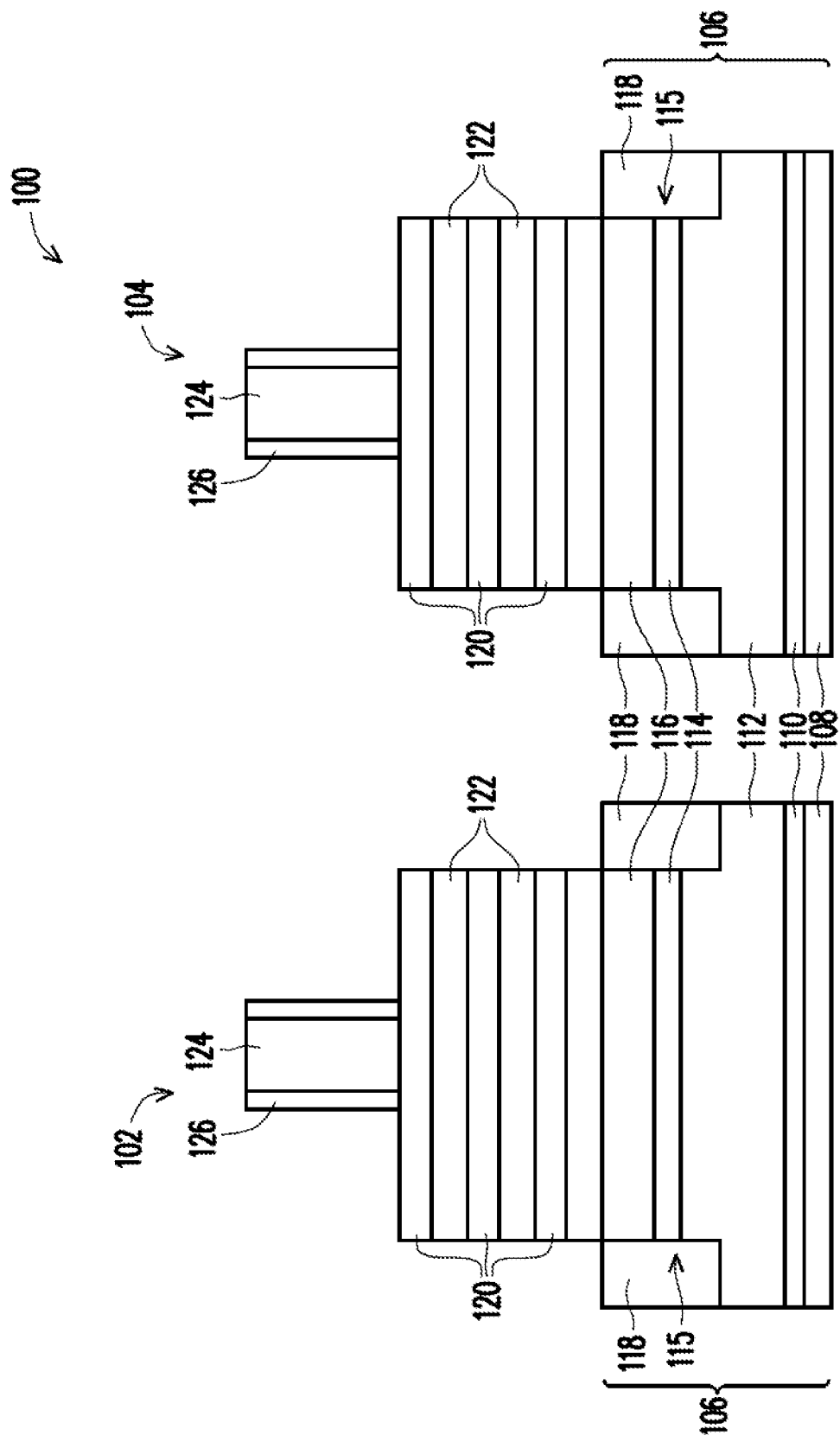
FIGS. 1A-1N are cross-sectional views of an integrated circuit including a resistive random access memory cell at various stages of processing, according to some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide resistive random access memory (RRAM) cells. Each cell includes a transistor and a resistor device. The transistor is a gate all around nanosheet transistor. The resistor device includes similar structures to the gate all around transistor and can be formed in the same processing steps. The resistor device includes a dielectric layer that acts as an adjustable resistor and memory storage element of the memory cell. Embodiments of the present disclosure provide many benefits over traditional RRAM cells. The transistor and the resistor device are formed with many of the same structures in overlapping process steps. This reduces the number of additional steps and provides a resistor device with feature sizes and area footprints approximately the same as very small nanosheet transistors.

Figure 1B:
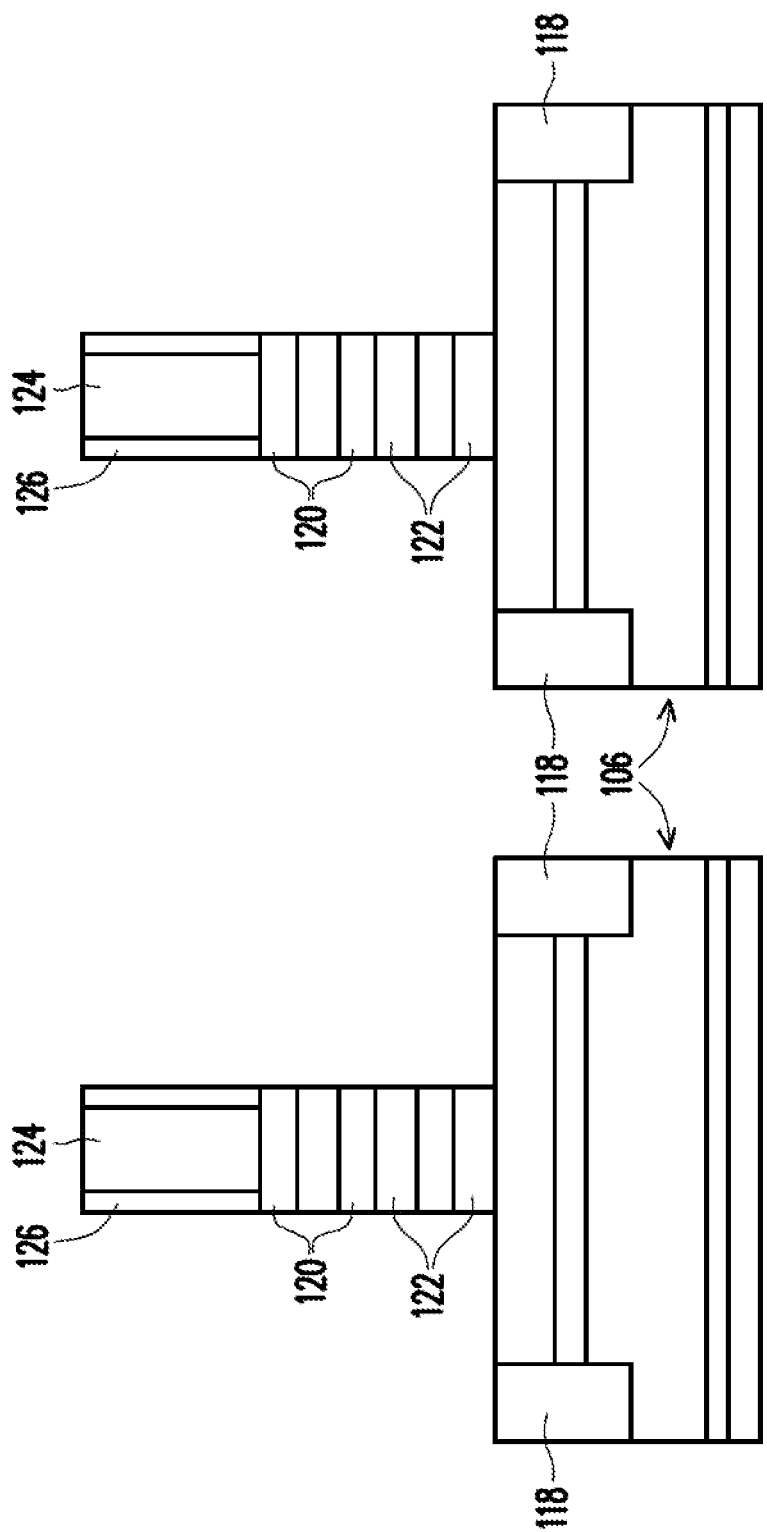
Figure 1C:
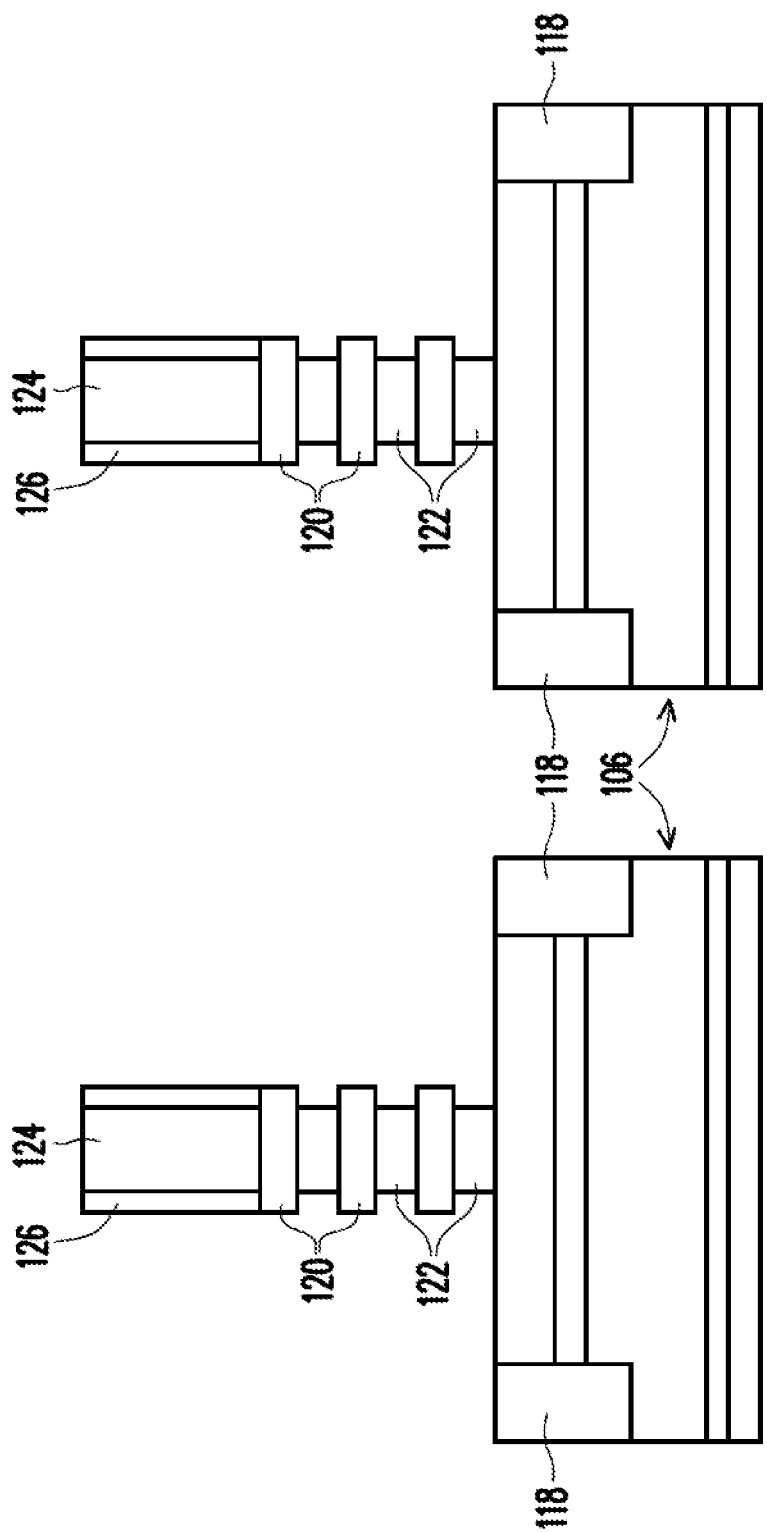
Figure 1D:
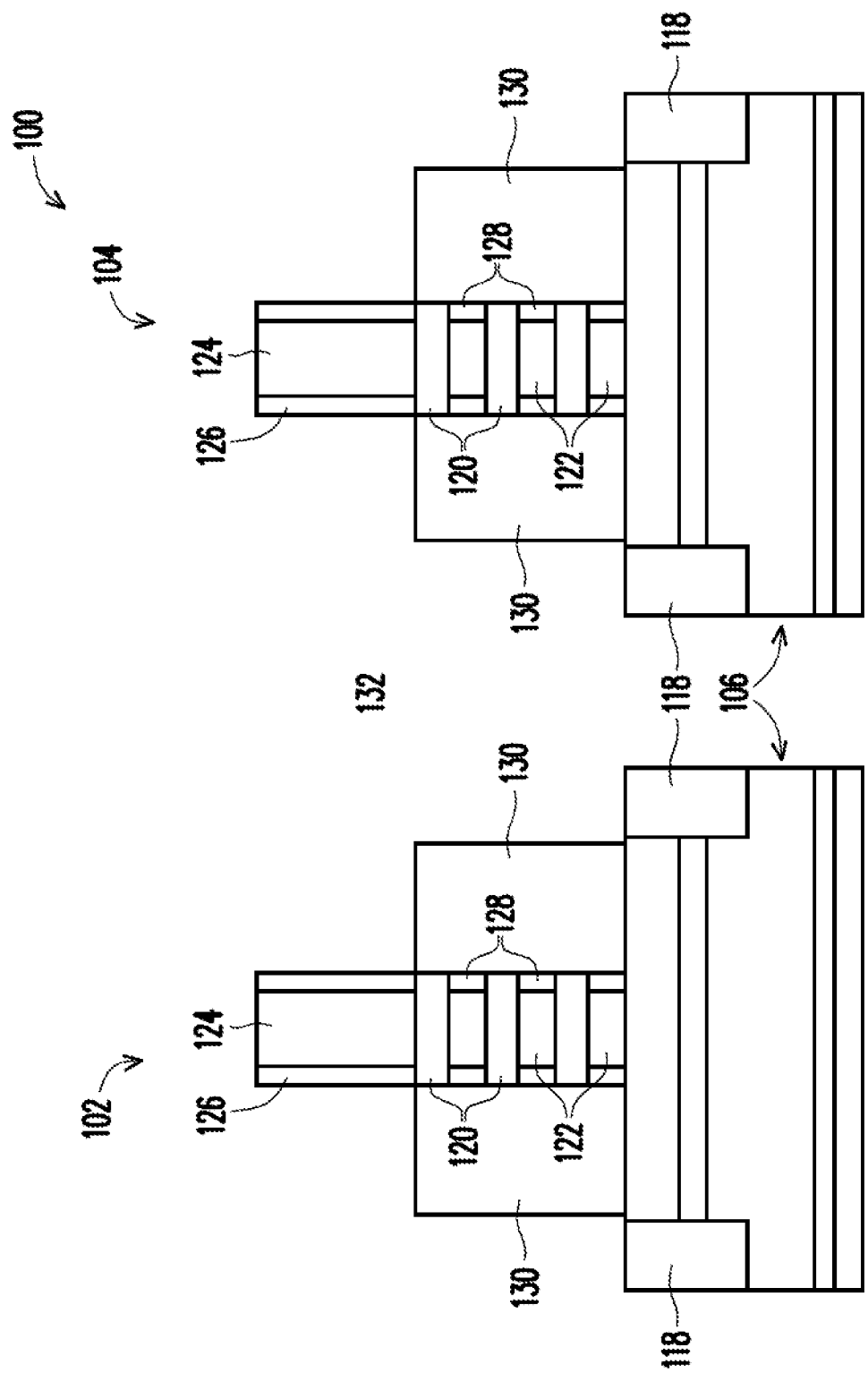
Figure 1E:
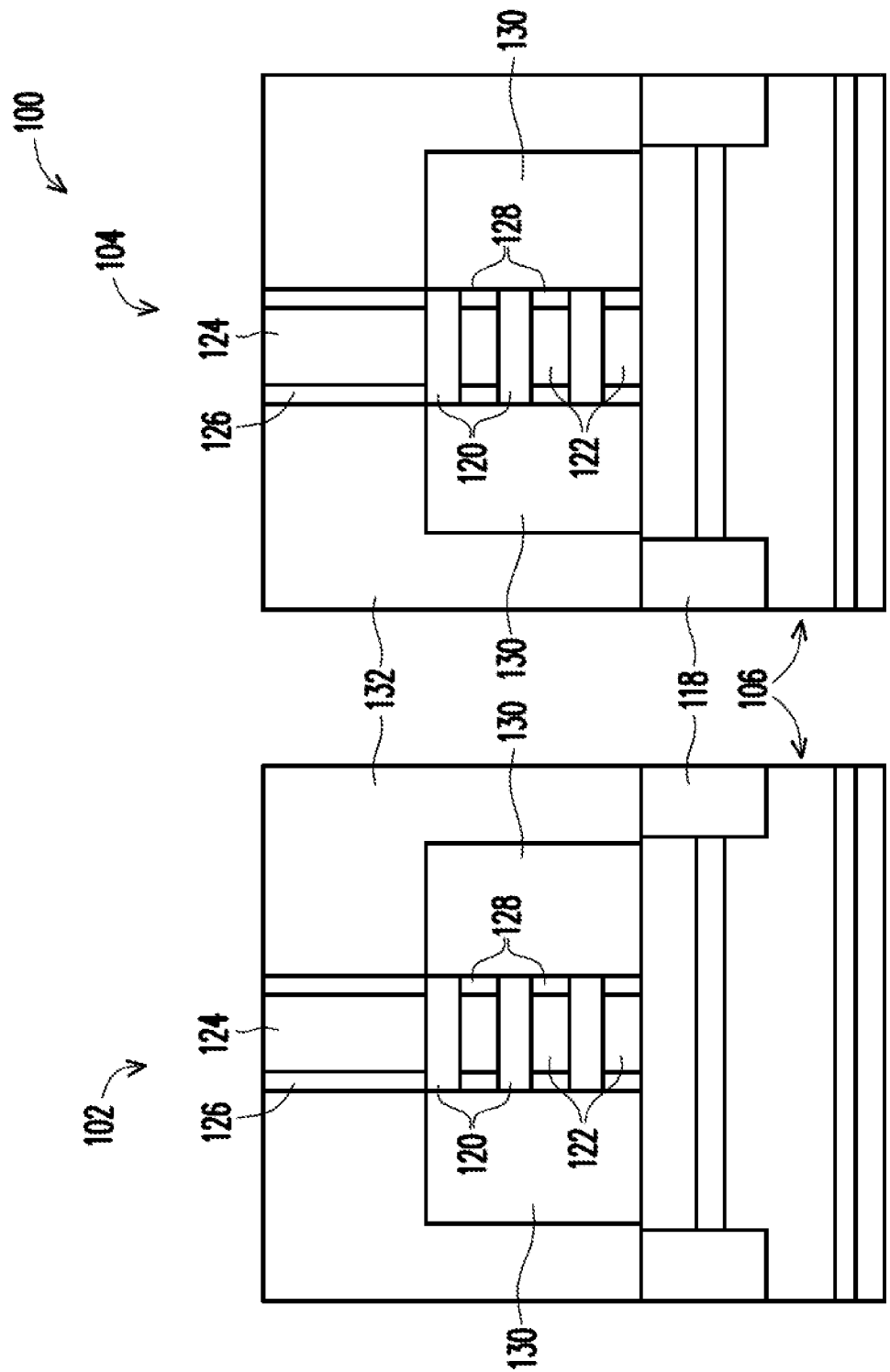
Figure 1F:
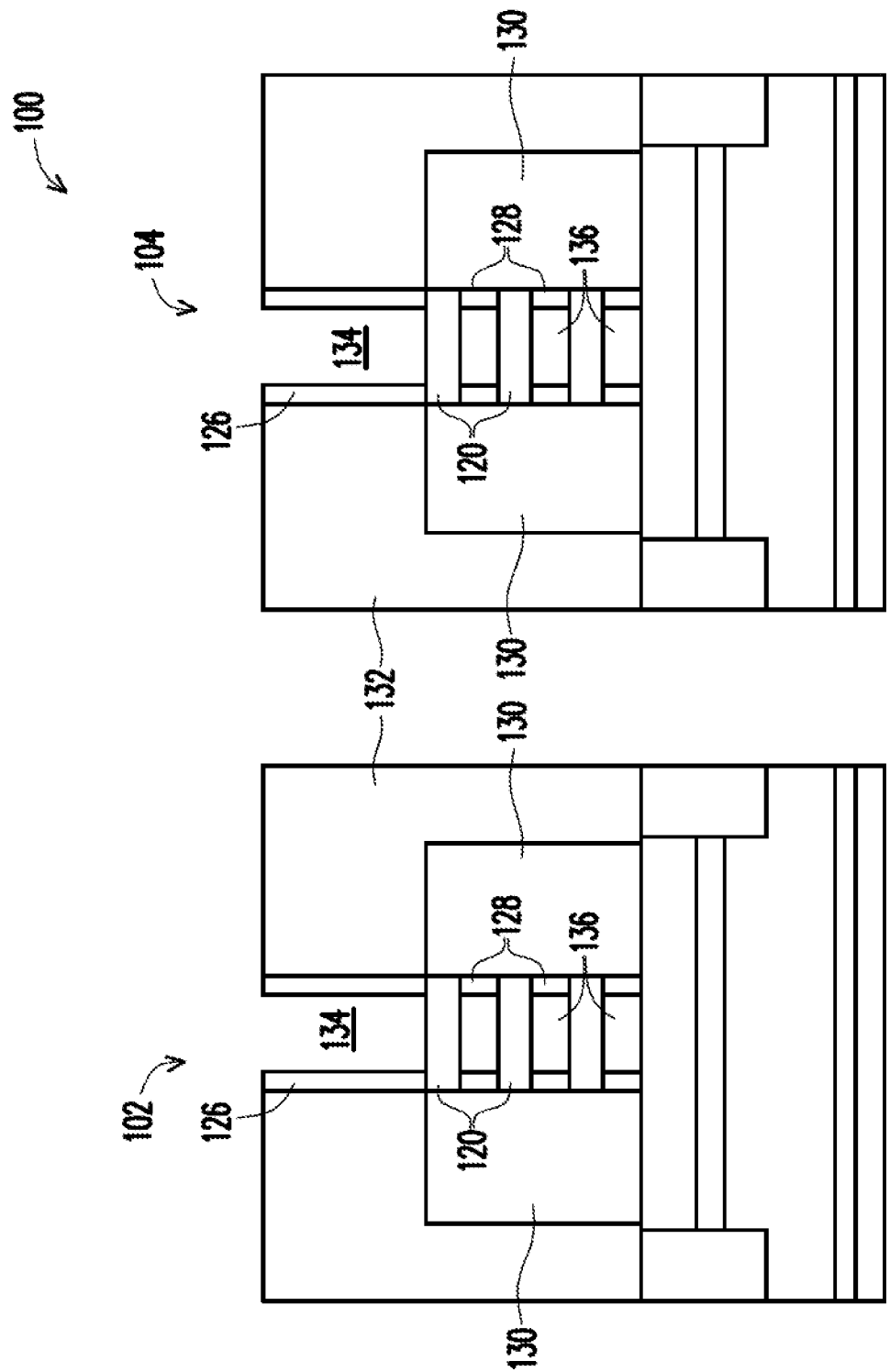
Figure 1G:
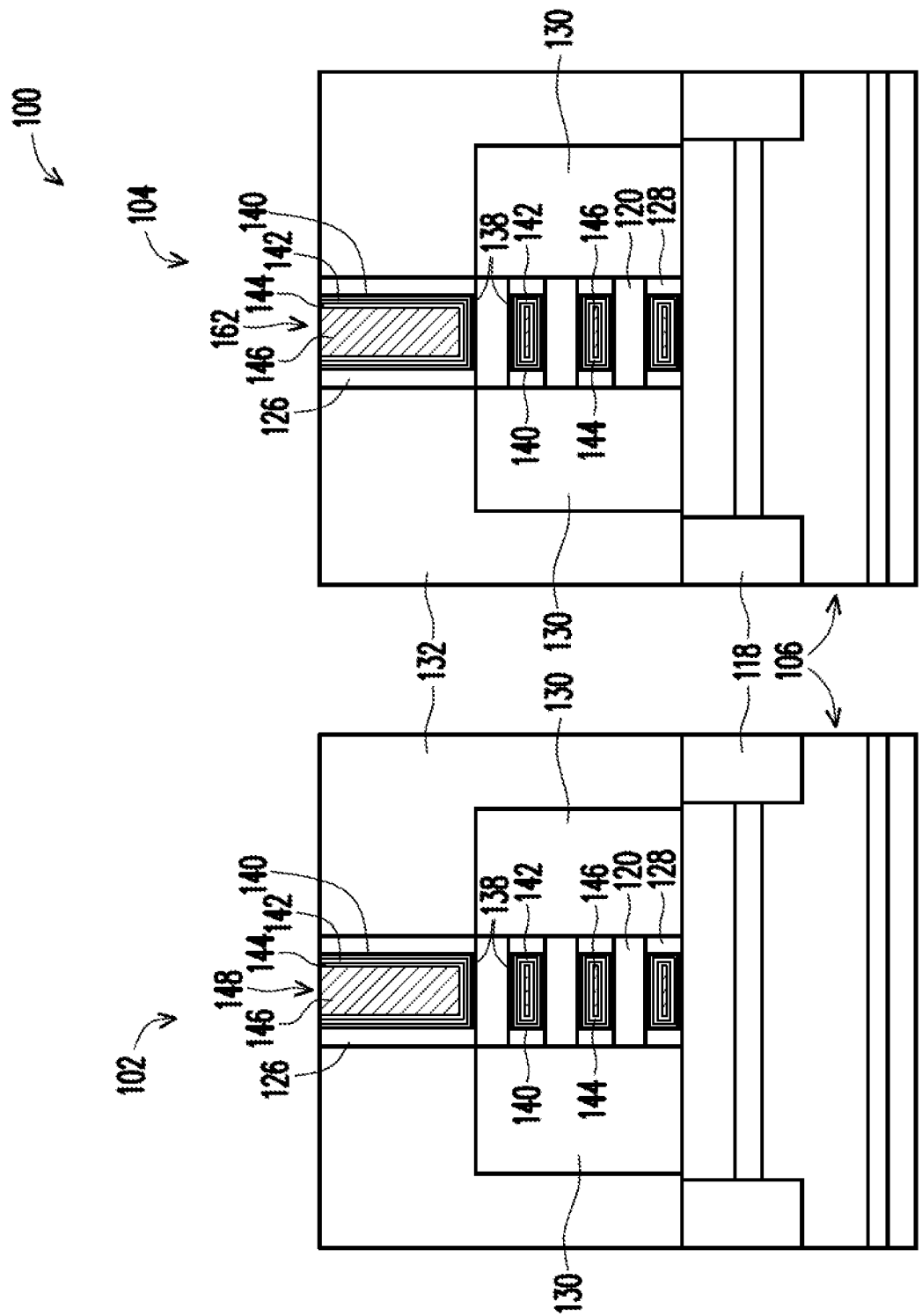
Figure 1H:
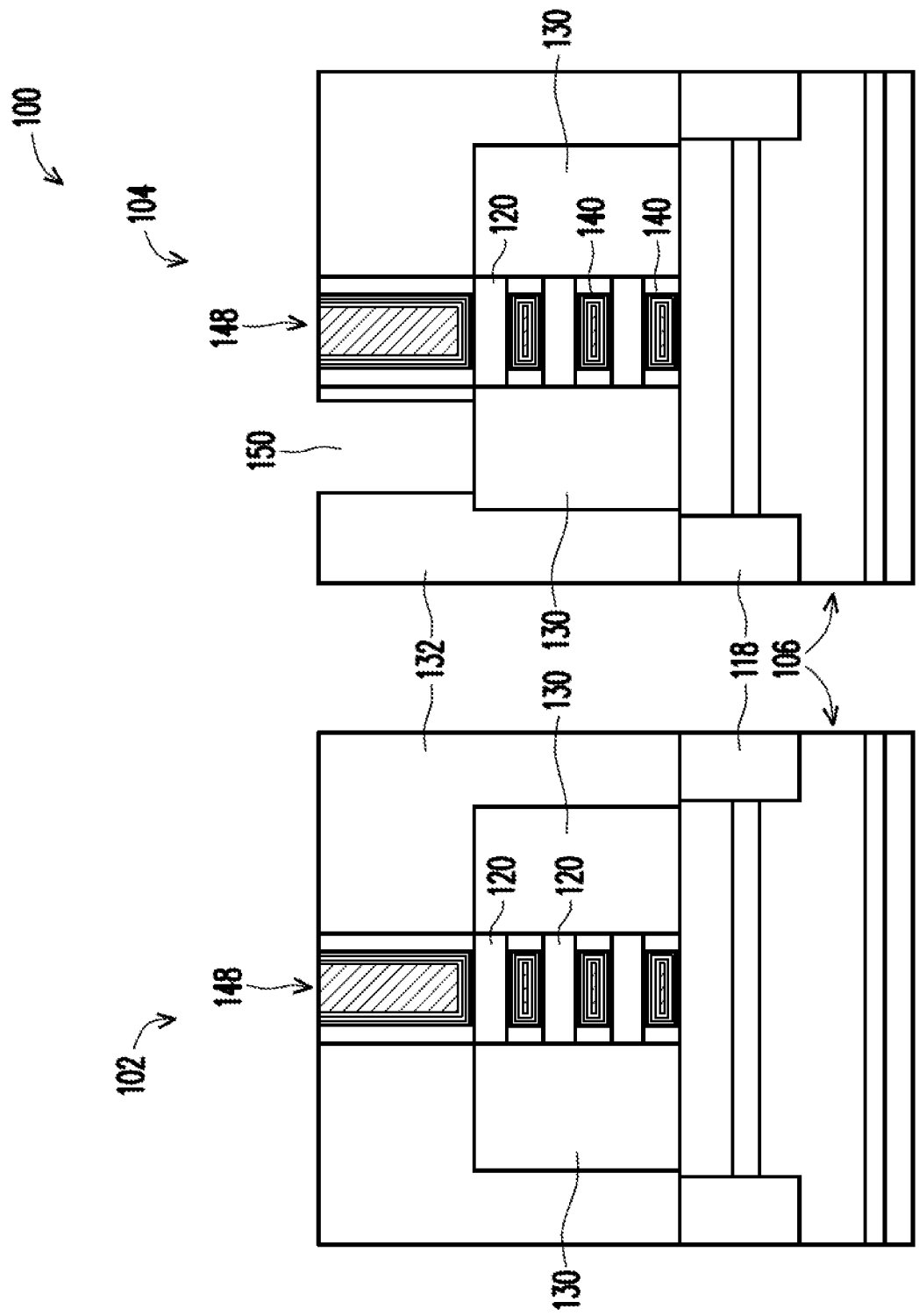
Figure 11:
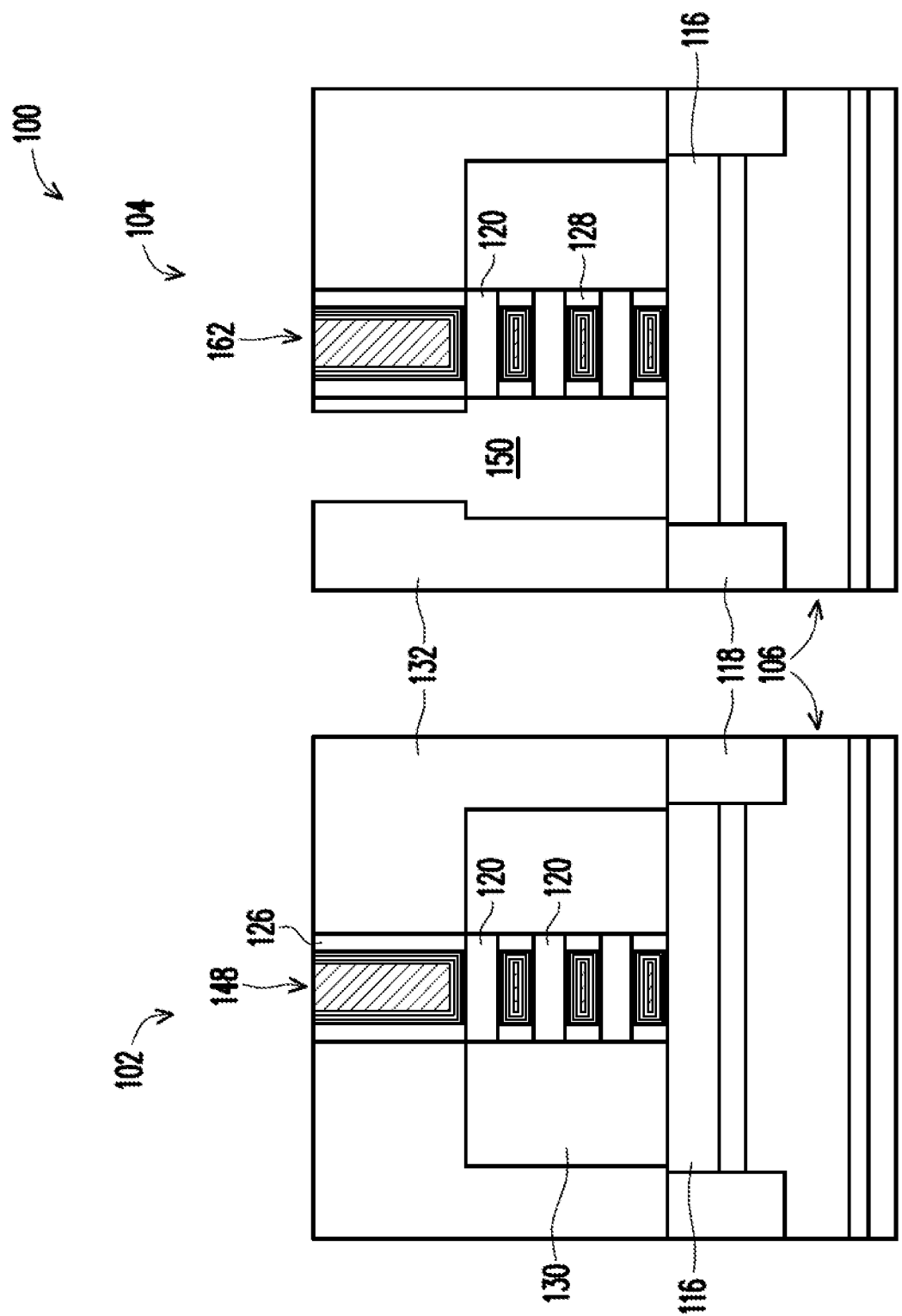
Figure 1J:
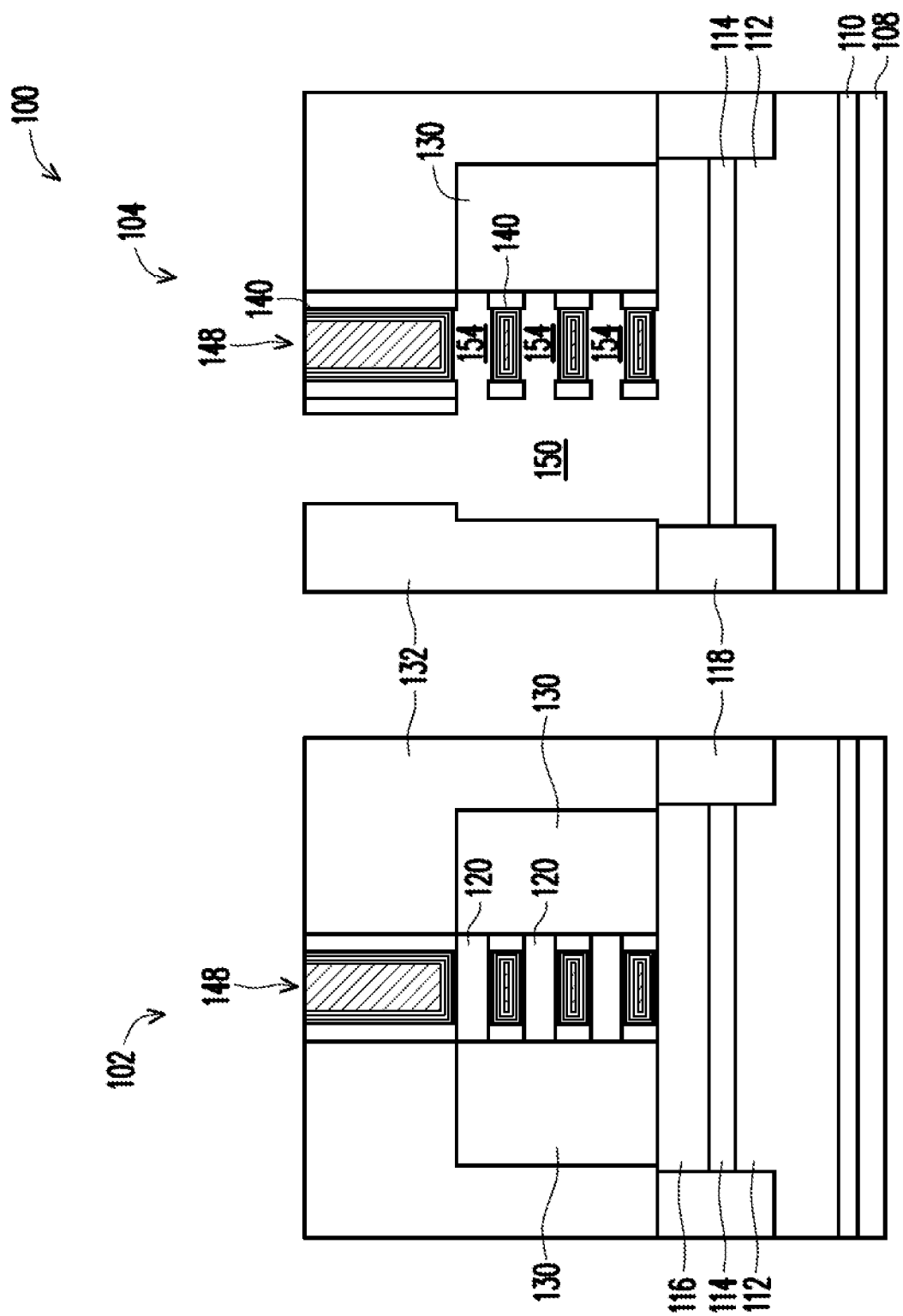
Figure 1K:
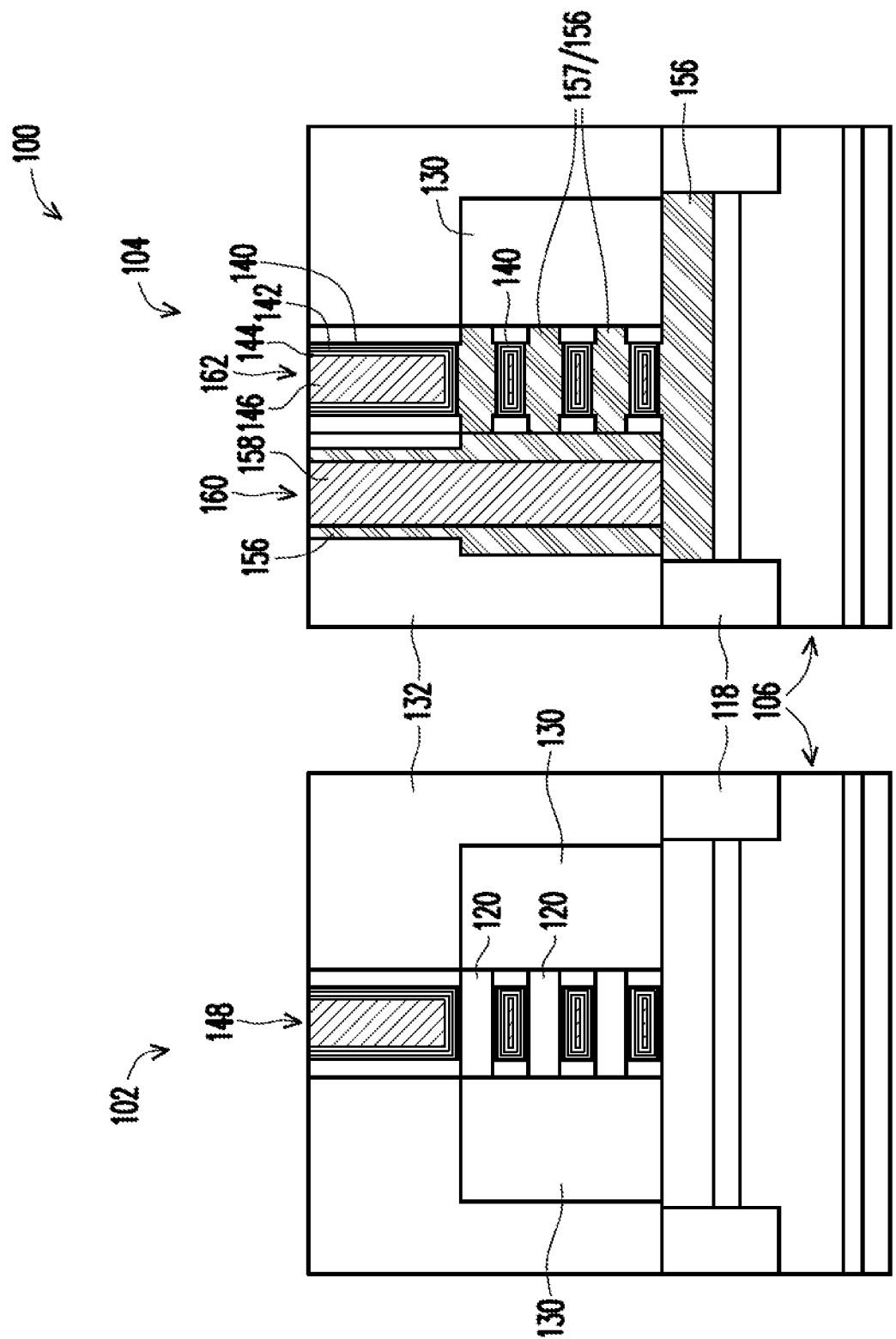
Figure 1L:
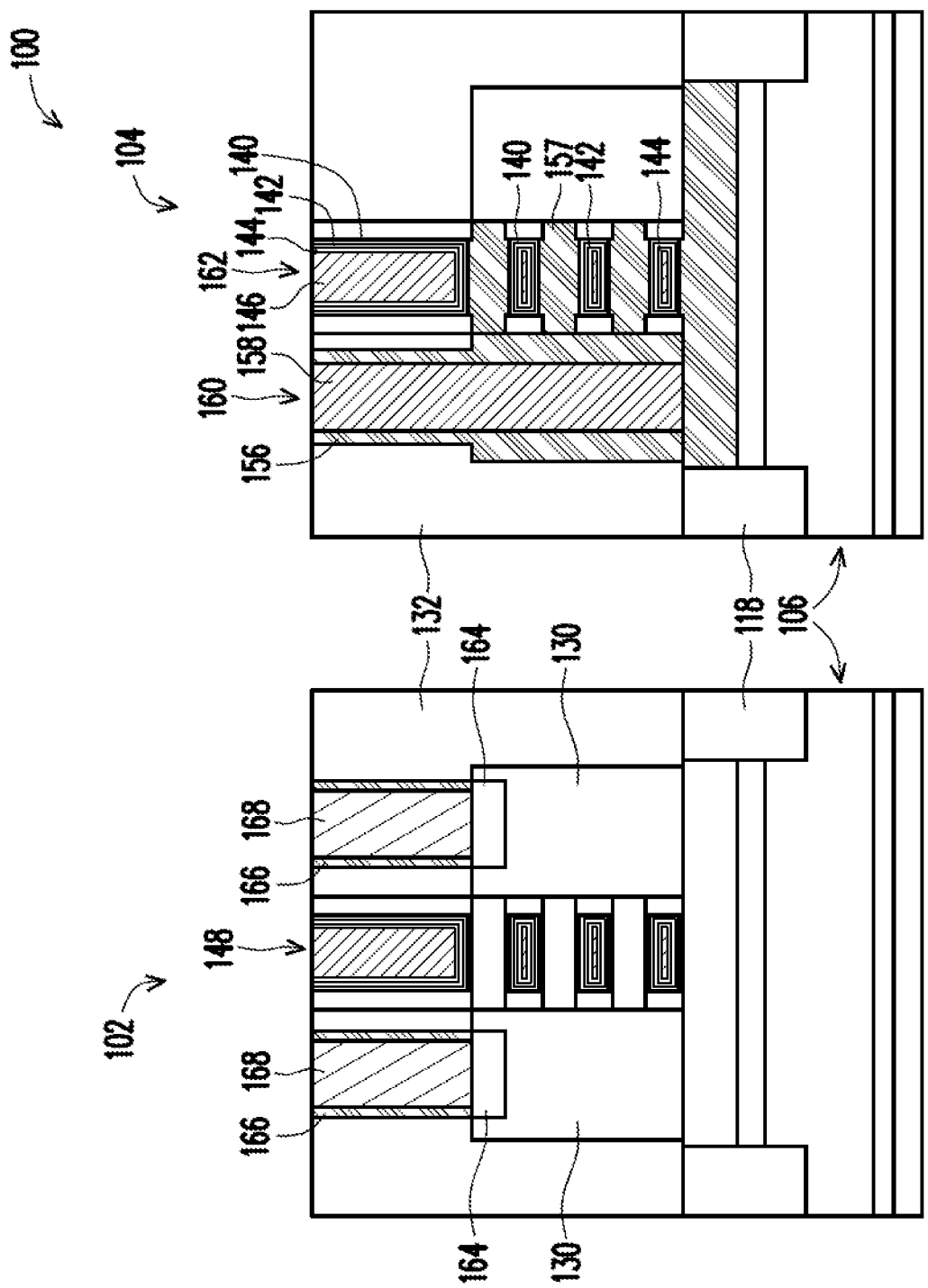
Figure 1M:
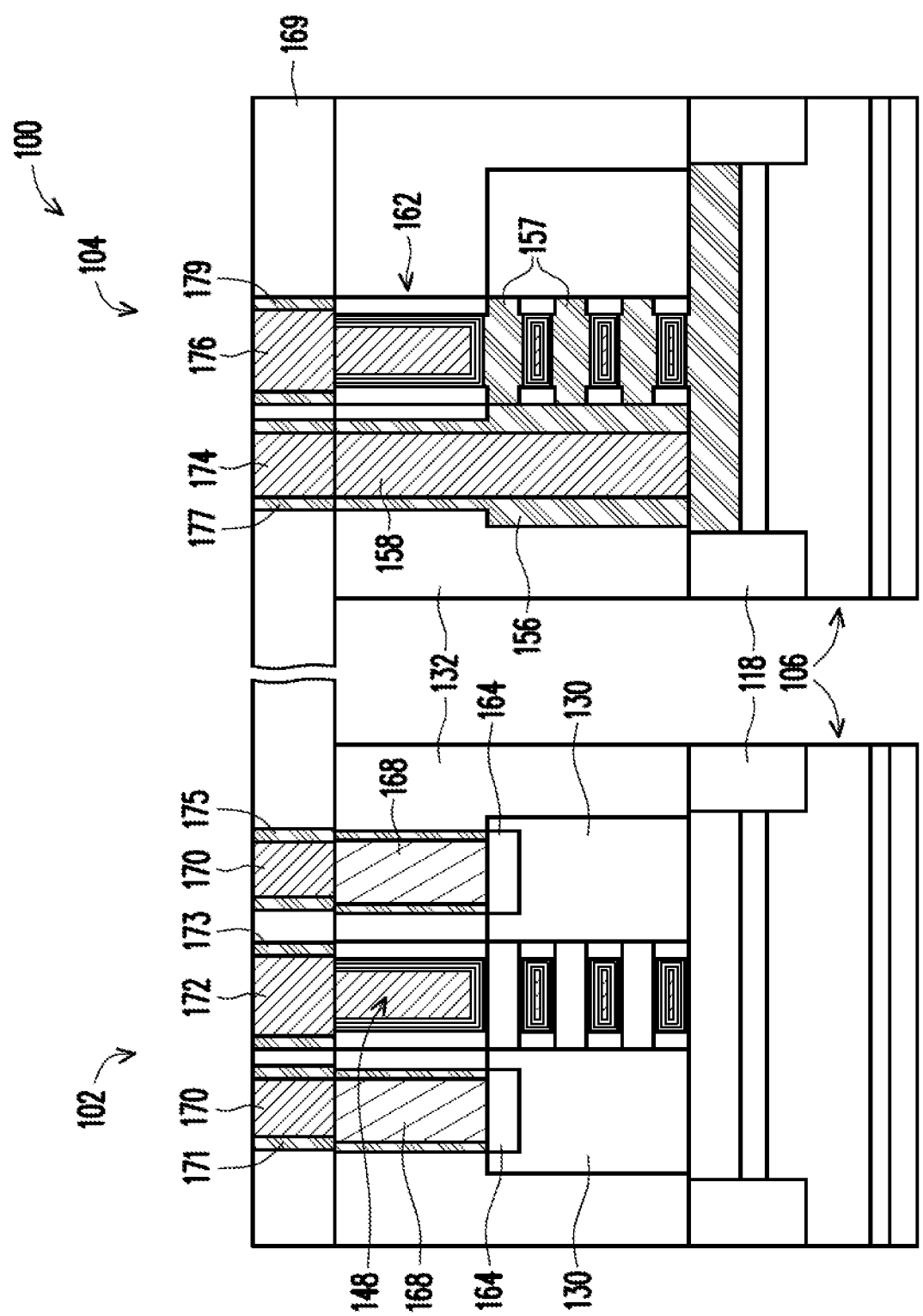
Figure 1N:
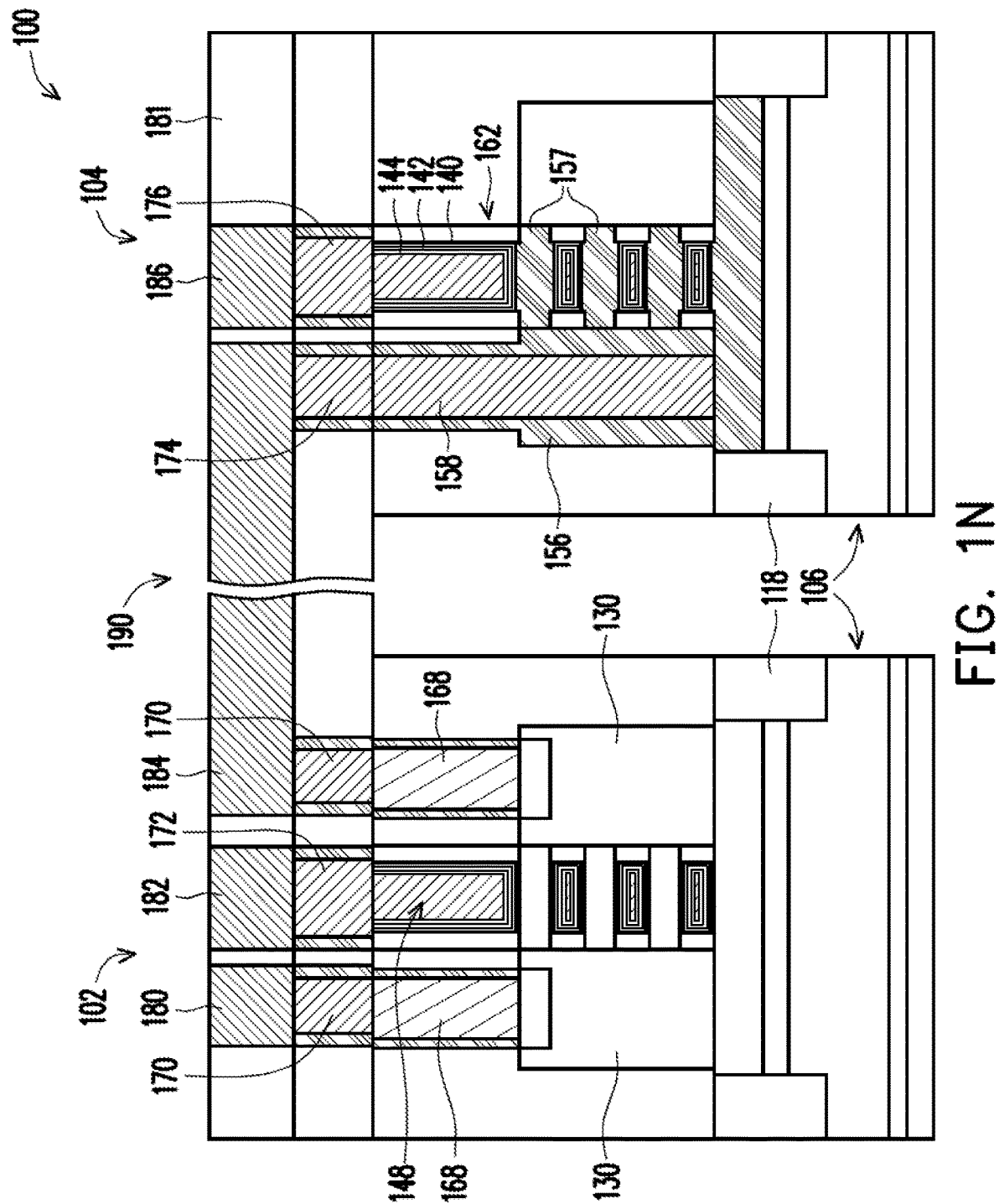

FIGS. 1A-N are cross-sectional views of an integrated circuit 100 at successive intermediate stages of processing, according to some embodiments. FIGS. 1A-N illustrate an exemplary process for producing an RRAM memory cell. The RRAM memory cell includes a gate all around transistor and a resistor device that includes the memory storage element of the memory cell. FIGS. 1A-N illustrate how the memory cell can be formed in a simple and effective process in accordance with principles of the present disclosure. Other process steps and combinations of process steps can be utilized without departing from the scope of the present disclosure.

FIG. 1A is a cross-sectional diagram of an integrated circuit 100 at an intermediate stage of processing, according to some embodiments. The view of FIG. 1A illustrates a transistor 102 and a resistor device 104 at an intermediate stage of processing. Accordingly, the transistor 102 and the resistor device 104 are not yet fully formed in the view of FIG. 1A. As will be set forth in more detail below, the resistor device 104 shares many of the same structures as the transistor 102. Accordingly, the process for forming the transistor 102 and the resister 104 heavily overlap, thereby reducing the number of process steps utilized to form then resistor device. Additionally, the resistor device can be formed with a very small area footprint because the resistor device 104 is formed with a same or similar area footprint as the very small transistor 102.

The transistors 102 is a gate all around transistor. The gate all around transistor structure may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In FIGS. 1A-1G, the transistor 102 and the resistor device 104 have the same or substantially similar structures and undergo the same processing steps, in accordance with one embodiment. Accordingly, the description of FIGS. 1A-1G will refer primarily to the transistor 102, however, it will be understood that the same structures may be present within the resistor device 104 as illustrated. In other embodiments, the transistor 102 and the resistor device 104 may have different structures and undergo different processing steps.

The integrated circuit 100 includes a substrate 106. The substrate 106 can include a silicon on insulator (SOI) structure. For example, the substrate 106 can include a bulk semiconductor layer 108 and an insulator layer 110 on the bulk semiconductor layer 108. The bulk semiconductor layer 108 can include a monocrystalline semiconductor such as silicon, silicon germanium, or other semiconductor materials. The insulator layer 110 can include silicon oxide, silicon nitride, or other insulator or dielectric materials.

In the example of FIG. 1A, the substrate 106 includes a first semiconductor layer 112, a second semiconductor layer 114 on the first semiconductor layer 112, and a third semiconductor layer 116 on the second semiconductor layer 114. In some embodiments, the first semiconductor layer 112 includes silicon; however, embodiments of the present disclosure are not limited thereto, and in various embodiments, the first semiconductor layer may include any suitable semiconductor material. The second semiconductor layer 114 can include silicon germanium. The third semiconductor layer 116 can include silicon. The first, second, and third semiconductor layers 112, 114, and 116 can collectively act as a semiconductor substrate 115. The semiconductor substrate 115 can include different numbers of layers in different semiconductor materials than those shown in FIG. 1A and described above without departing from the scope of the present disclosure. The semiconductor substrate 115 can include various doped regions including N-type and P-type dopants. N-type dopants can include phosphorus. P-type dopants can include boron. Other types of dopants can be utilized without departing from the scope of the present disclosure.

The integrated circuit 100 includes a shallow trench isolation 118. The shallow trench isolation 118 can be utilized to separate one or more semiconductor device structures, such as the transistor 102 and the resistor 104, formed on or in conjunction with the semiconductor substrate 115. The shallow trench isolation 118 can include a dielectric material. For example, in some embodiments, the shallow trench isolation 118 includes a trench that is formed extending into the semiconductor substrate 115, and a dielectric material that fills or substantially fills the trench. The dielectric material for the shallow trench isolation 118 may include silicon oxide, silicon nitride, silicon oxynitride (SON), SiOCN, SiCN, fluorine-doped silicate glass (FSG), or a low-K dielectric material, formed by LPCVD (low pressure chemical vapor deposition), plasma-CVD or flowable CVD. Other materials and structures can be utilized for the shallow trench isolation 118 without departing from the scope of the present disclosure.

The integrated circuit 100 includes a plurality of semiconductor nanosheets 120 or nanowires. The semiconductor nanosheets 120 are layers of semiconductor material. The semiconductor nanosheets 120 correspond to the channel regions of the gate all around transistors that will result from the process described. The semiconductor nanosheets 120 are formed over the substrate 106, and may be formed on the semiconductor substrate 115. The semiconductor nanosheets 120 may include one or more layers of Si, Ge, SiGe, GaAs, InSb, GaP, GaSb, InAlAs, InGaAs, GaSbP, GaAsSb or InP. In at least one embodiment, the semiconductor nanosheets 120 are the same semiconductor material as the substrate 102. Other semiconductor materials can be utilized for the semiconductor nanosheets 120 without departing from the scope of the present disclosure. In a non-limiting example described herein, the semiconductor nanosheets 120 and the substrate 102 are silicon.

The integrated circuit 100 includes a plurality of sacrificial semiconductor nanosheets 122 positioned between the semiconductor nanosheets 120. The sacrificial semiconductor nanosheets 122 include a different semiconductor material than the semiconductor nanosheets 120. In an example in which the semiconductor nanosheets 120 include silicon, the sacrificial semiconductor nanosheets 122 may include SiGe. In one example, the silicon germanium sacrificial semiconductor nanosheets 122 may include between 20% and 30% germanium, though other concentrations of germanium can be utilized without departing from the scope of the present disclosure.

In one embodiment, the semiconductor nanosheets 120 and the sacrificial semiconductor nanosheets 122 are formed by alternating epitaxial growth processes from the third semiconductor layer 116. For example, a first epitaxial growth process may result in the formation of the lowest sacrificial semiconductor nanosheet 122 on the top surface of the third semiconductor layer 116. A second epitaxial growth process may result in the formation of the lowest semiconductor nanosheet 120 on the top surface of the lowest sacrificial semiconductor nanosheet 122. A third epitaxial growth process results in the formation of the second lowest sacrificial semiconductor nanosheet 122 on top of the lowest semiconductor nanosheet 120. Alternating epitaxial growth processes are performed until a selected number of semiconductor nanosheets 120 and sacrificial semiconductor nanosheets 122 have been formed.

In FIG. 1A, the transistor 102 has three semiconductor nanosheets 120. However, in practice, the transistor 102 may have more semiconductor nanosheets 120 than three. For example, the transistor 102 may include between 8 and 20 semiconductor nanosheets 120 in some embodiments. Other numbers of semiconductor nanosheets 120 can be utilized without departing from the scope of the present disclosure.

The semiconductor nanosheets 120 can have thicknesses between 2 nm and 100 nm. In one embodiment, the semiconductor nanosheets 120 have thicknesses between 2 nm and 20 nm. This range provides suitable conductivity through the nanosheets while retaining a low thickness. In some embodiments, each nanosheet 120 is thicker than the nanosheet(s) 120 above it. The semiconductor nanosheets 120 can have other thicknesses without departing from the scope of the present disclosure.

In FIG. 1A a dummy gate 124 has been deposited and patterned on the top semiconductor nanosheet 120. The dummy gate 124 can include polysilicon. The dummy gate 124 can have a thickness between 20 nm and 100 nm. The polysilicon dummy gate can be deposited by an epitaxial growth, a CVD process, a physical vapor deposition (PVD) process, or an ALD process. Other thicknesses and deposition processes can be used for depositing the material of the dummy gate 124 without departing from the scope of the present disclosure.

The dummy gate 124 can be patterned by standard photolithography processes. For example, the dummy gate 124 can be patterned by etching the dummy gate 124 in the presence of the photoresist mask, a hard mask or other types of masks.

In FIG. 1A, a gate spacer 126 has been deposited on the sides of the dummy gate 124. In one example, the gate spacer 126 includes SiCON. The gate spacer 126 can be deposited by CVD, PVD, or ALD. Other materials and deposition processes can be utilized for the gate spacer 126 without departing from the scope of the present disclosure.

In FIG. 1B, the semiconductor nanosheets 120 and the sacrificial semiconductor nanosheets 122 have been etched. The dummy gate 124 and the gate spacer 126 have been used as a mask to pattern the semiconductor nanosheets 120 and the sacrificial semiconductor nanosheets 122. In particular, an etching process has been performed in the presence of the dummy gate 124 and the gate spacer 126 to etch the semiconductor nanosheets 120 and the sacrificial semiconductor nanosheets 122.

In FIG. 1C the etching process has been performed to laterally recess the sacrificial semiconductor nanosheets 122 with respect to the semiconductor nanosheets 120. The etching process can be performed by a chemical bath that selectively etches the sacrificial semiconductor nanosheets 122 with respect to the semiconductor nanosheets 120. As described previously, in one example the sacrificial semiconductor nanosheets 122 are SiGe. This difference in composition from the semiconductor nanosheets 120 allows the sacrificial semiconductor nanosheets 122 to be selectively etched with respect to the semiconductor nanosheets 120. Accordingly, the etching process of FIG. 1C recesses the sacrificial semiconductor nanosheets 122 without significantly etching the semiconductor nanosheets 120. The etching process is timed so that the sacrificial semiconductor nanosheets 122 are recessed but not entirely removed. The recessing process is utilized to enable the formation of an inner sheet spacer layer between the semiconductor nanosheets 120 at the locations where the sacrificial semiconductor nanosheets 122 have been removed.

In FIG. 1D a sheet inner spacer layer 128 has been formed (e.g., by deposition) between the semiconductor nanosheets 120. The sheet inner spacer layer 128 can be deposited by an ALD process, a CVD process, or other suitable processes. In one example, the sheet inner spacer layer 128 includes silicon nitride. After formation of the sheet inner spacer layer 128, and etching processes may be performed utilizing the gate spacer 126 as a mask. The etching process removes the sheet inner spacer layer 128 except directly below the gate spacer 126. Other processes and materials can be utilized for the sheet inner spacer layer 128 without departing from the scope of the present disclosure.

In FIG. 1D source and drain regions 130 have been formed. The source and drain regions 130 includes semiconductor material. The source and drain regions 130 can be grown epitaxially from the semiconductor nanosheets 120. The source and drain regions 130 can be epitaxially grown from the semiconductor nanosheets 120 or from the substrate 102. The source and drain regions 130 can be doped with N-type dopants species in the case of N-type transistors. The source and drain regions 130 can be doped with P-type dopant species in the case of P-type transistors. The doping can be performed in-situ during the epitaxial growth. While the source and drain regions 130 are labeled with a common reference number and title, in practice, the transistor 102 will have a source region and the drain region. For example, the region 130 on the left of the transistor 102 may correspond to a source of the transistor 102. The region on the right of the transistor 102 may correspond to a drain of the transistor 102. Alternatively, the drain may be on the left and the source may be on the right.

In FIG. 1E an interlevel dielectric layer 132 has been deposited on the source and drain regions 130 and on the shallow trench isolation 118. The interlevel dielectric layer 132 can include silicon oxide. The interlevel dielectric layer 132 can be deposited by CVD, ALD, or other suitable processes. After deposition of the interlevel dielectric layer 132, a CMP process can be performed to planarize the top surface of the interlevel dielectric layer 132 and to make the top surface of the interlevel dielectric layer 132 at the same level as the top surface of the dummy gate 124 and the gate spacer 126. Other materials and processes can be utilized for the interlevel dielectric layer 132 without departing from the scope of the present disclosure.

In FIG. 1F, the dummy gate 124 and the sacrificial semiconductor nanosheets 122 have been removed. The dummy gate 124 can be removed in a first etching step. The sacrificial semiconductor nanosheets 122 can then be removed in a second etching step. Both the first and the second etching steps selectively etches the corresponding layer with respect to the material of the semiconductor nanosheets 120. Alternatively, a single etching process can be utilized to remove both the sacrificial semiconductor cladding 114 and the sacrificial semiconductor nanosheets 122.

The removal of the dummy gate 124 leaves a gate trench 134. The gate trench 134 corresponds to the location at which the portion of the gate electrode of the transistor 102 will be formed. The removal of the sacrificial semiconductor nanosheets 122 leaves a gap 136 around the semiconductor nanosheets 120. In practice, the gate trench 134 and the gap 136 are contiguous with each other such that the gate trench 134 and the gaps 136 are a single contiguous void at the stage shown in FIG. 1F.

In FIG. 1G an interfacial dielectric layer 138 has been deposited on the exposed surfaces of the semiconductor nanosheets 120. The interfacial dielectric layer 138 can include a dielectric material such as silicon oxide, silicon nitride, or other suitable dielectric materials. The interfacial dielectric layer 138 can include a comparatively low-K dielectric with respect to high-K dielectrics such as hafnium oxide or other high-K dielectric materials that may be used in gate dielectrics of transistors. The interfacial dielectric layer 138 can be formed by a thermal oxidation process, a CVD process, or an ALD process. The interfacial dielectric layer 138 can have a thickness between 0.5 nm and 2 nm. Other materials, deposition processes, and thicknesses can be utilized for the interfacial dielectric layer without departing from the scope of the present disclosure.

Though not apparent in the cross-sectional view of FIG. 1G, the interfacial dielectric layer 138 surrounds the semiconductor nanosheets 120. In particular, the semiconductor nanosheets 120 have a shape corresponding to a slat or wire extending between the source and drain regions 130. The interfacial dielectric layer 138 wraps around each semiconductor nanosheet 120. The interfacial dielectric layer 138 surrounds or partially surrounds the semiconductor nanosheets 120.

In FIG. 1G, a high-K gate dielectric layer 140 has been formed on the interfacial dielectric layer 138, on the sidewalls of the gate spacers 126, and on the sidewalls of the sheet inner spacers 128. Together, the high-K gate dielectric layer 140 and the interfacial dielectric layer 138 correspond to a gate dielectric of the transistor 102. The high-K dielectric layer 140 surrounds or partially surrounds the semiconductor nanosheets 120 in the same way as described in relation to the interfacial dielectric layer 138, except that the interfacial dielectric layer is between the semiconductor nanosheets 120 and the high-K gate dielectric layer 140.

The high-K gate dielectric layer 140 includes one or more layers of a dielectric material, such as $HfO_2$, HfSiO, HfSiON, HfTaO, HMO HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer 140 may be formed by CVD, ALD, or any suitable method. In one embodiment, the high-K gate dielectric layer 140 is formed using a highly conformal deposition process such as ALD in order to ensure the formation of a gate dielectric layer having a uniform thickness around each semiconductor nanosheet 104. In one embodiment, the thickness of the high-k dielectric layer 140 is in a range from about 1 nm to about 4 nm. Other thicknesses, deposition processes, and materials can be utilized for the high-K gate dielectric layer without departing from the scope of the present disclosure. The high-K gate dielectric layer 140 may include a first sub-layer that includes HfO2 with dipole doping including La and Mg, and a second sub-layer including a higher-K ZrO layer with crystallization. In particular, the first sub-layer may include a primarily amorphous structure while the second sub-layer may include a primarily crystalline structure. In one embodiment, the first layer is between 0.5 nm and 2 nm in thickness. In one embodiment, the second layer is between 0.5 nm and 2 nm in thickness.

In one embodiment, the high-K gate dielectric layer 140 of the resistor device 104 may include only the first or second sub-layer whereas the high-K dielectric layer 140 of the transistor 102 may include both the first and second sub-layers. In one example, after deposition of the first and second sub-layers of the high-K dielectric layer 140, the second sub-layer may be removed from the resistor device 104. This can be accomplished by masking the region of the transistor 102 and performing a controlled etching process at the exposed high-K gate dielectric layer 140 of the resistor device 104. The controlled etching process removes the second sub-layer of the high-K dielectric layer 140 at the resistor device 104 without removing the first sub-layer of the high-K dielectric layer 140 of the resistor device 104.

In one embodiment, because the sub-layers of the high-K dielectric layer 140 are very thin, a tightly controlled atomic layer etching (ALE) process is performed to remove the second sub-layer of the high-K dielectric layer 140 at the resistor device 104. The ALE process is able to remove a single atomic or molecular layer of the second sub-layer in each ALE cycle. The number and duration of each cycle can be selected to remove the second sub-layer without removing the first sub-layer.

In one embodiment, the ALE process is controlled by an analysis model trained with a machine learning process. Further details regarding the controlled ALE process are provided in relation to FIGS. 5A and 5B.

In FIG. 1G, a first metal layer 142 is deposited on the high-K gate dielectric 140 in the trench 134 and in the voids 136 between semiconductor nanosheets 120. In one embodiment, the first metal layer 142 includes titanium. The first metal layer 142 can be deposited using PVD, ALD, CVD, or other suitable deposition processes. The first metal layer 142 can have a thickness between 1 nm and 3 nm. Other materials, deposition processes, and thicknesses can be utilized for the first metal layer 142 without departing from the scope of the present disclosure.

In FIG. 1G, a second metal layer 144 has been deposited on the first metal layer 142 in the trench 134 and in the voids 136 between semiconductor nanosheets 120. In one example, the second metal layer 144 includes titanium nitride. The second metal layer 144 can be deposited using PVD, ALD, CVD, or, or other suitable, deposition processes. The second metal layer 144 can have a thickness between 1 nm and 3 nm, Other materials, deposition processes, and thicknesses can be utilized for the second metal layer 144 without departing from the scope of the present disclosure.

In FIG. 1G, a third metal layer 146 has been deposited on the second metal layer 144 in the trench 134 and in the voids 136 between semiconductor nanosheets 120. In one example, the third metal layer 146 includes tungsten. The third metal layer 146 can be deposited using PVD, ALD, CVD, or, or other suitable deposition processes. The third metal layer 146 fills the remaining space in the trench 134 and in the voids 136 between semiconductor nanosheets 120. For this reason, the third metal layer 146 is a trench fill or gate fill material. The gate fill material is highly conductive. The first and second metal layers 142 and 144 are very thin so that as much of the trench 134 in the voids 136 is possible can be filled with the gate fill material. This ensures that the gate electrode 148 of the transistor 102 will be highly conductive. The gate electrode of the transistor 102 corresponds to the first, second, and third metal layers 142, 144, and 146. Other materials, deposition processes, and thicknesses can be utilized for the second metal layer 144 without departing from the scope of the present disclosure. The first, second, and third metal layers 142, 144, and 146 correspond to the gate electrode 148 of the transistor 102.

The first, second, and third metal layers 142, 144, and 146 surround or partially surround the semiconductor nanosheets 120 in the same way as described above in relation to the interfacial dielectric layer 138 and the high-K gate dielectric layer 140, except that the interfacial dielectric layer and the high-K gate dielectric layer 140 are positioned between the semiconductor nanosheets 120 and the first, second, and third metal layers 142, 144, and 146, In the resistor device 104, the high-K gate dielectric 140 is not utilized as a gate dielectric because the resistor device 104 will not be a transistor in the end. In the case of the resistor device 104, the high-K gate dielectric 140 is a resistive element and a data storage element as described in more detail below. Additionally, in the case of the resistor device 104, the first, second, and third metal layers 142, 144, and 146 do not act as a gate electrode because the resistor device 104 is not a transistor with a gate terminal. Instead, the first, second, and third metal layers 142, 144. and 146 may correspond to a top electrode 162 of the resistor device.

The first, second, and third metal layers 142, 144, and 146 surround the semiconductor nanosheets 120. The semiconductor nanosheets 120 are physically separated from the first, second, and third metal layers 142, 144, and 146 by the gate dielectric made up of the interfacial dielectric layer 138 and the high-K gate dielectric layer 140, For this reason, the transistor 102 is called a gate all around transistor, because the gate electrode 148 surrounds the semiconductor nanosheets 120. The semiconductor nanosheets 120 correspond to the channel regions of the transistor 102. When the transistor 102 is turned on by application of a voltage between the source and the gate electrode 148, current flows between the source and drain regions 130 through the semiconductor nanosheets 120 in the transistor 102.

In FIG. 1H, the structure of the resistor device 104 begins to diverge from the structure of the transistor 102. In FIG. 1H, a trench 150 has been etched in the interlevel dielectric layer 132. The trench 150 exposes the left source/drain region 130 of the resistor device 104. The trench 150 can be formed by etching the interlevel dielectric layer 132 in the presence of a mask. The pattern of the mask 150 ensures that the etch will result in the trench 150 at the location shown in FIG. 1H.

In FIG. 1I, the trench 150 is extended at the resistor device 104 by removing the source/drain region 130 on the left side of the resistor device 104. After the trench 150 has been opened in the interlevel dielectric layer 132 an etching process is performed to remove the source/drain region 130 on the left side of the resistor device 104. The etching process selectively etches the semiconductor material of the source/drain region 130 with respect to the interlevel dielectric layer 132, the third semiconductor layer 116, the sheet inner spacer 128, and the semiconductor nanosheets 120.

In FIG. 1J, an etching process has been performed to remove the third semiconductor layer 116, the semiconductor nanosheets 120, and the interfacial dielectric layer 138 from the resistor device 104. In an example in which the semiconductor nanosheets 120 are silicon, the third semiconductor layer 116 is silicon, and the interfacial dielectric layer 138 is silicon dioxide, a single etching process can be performed to remove the semiconductor nanosheets 120, the third semiconductor layer 116, and the interfacial dielectric layer 138 at the resistor device 104 via the trench 150.

The removal of the semiconductor nanosheets 120 results in a void 154 at the location of the removed semiconductor nanosheets 120. The trench 150 and the void 154 are contiguous with each other and may be considered a single trench or void, The etching process exposes the high-K gate dielectric layer 140.

In FIG. 1K, a layer of conductive material 156 has been deposited in the trenches 150, 152, and the void 154. In one example, the layer of conductive material 156 is titanium nitride deposited by an ALD process, though other materials and processes can be utilized without departing from the scope of the present disclosure. The layer of conductive material 156 lines the walls of the trench 150, and fills the voids 154 where the semiconductor nanosheets 120 were previously positioned. The layer of conductive material 156 forms conductive nanosheets 157 where the semiconductor nanosheets 120 were previously positioned. The conductive nanosheets 157 correspond to a bottom electrode of the resistor device 104. The conductive nanosheets 157 have a thickness corresponding to the thickness of the removed semiconductor nanosheets plus the thickness of the previously removed interfacial dielectric layer 138. Accordingly, the conductive nanosheets 157 are slightly thicker than the semiconductor nanosheets 120. In some embodiments the conductive nanosheets have a thickness between 2 nm and 7 nm. This range of thicknesses provides a thin profile and high conductivity. Other materials, deposition processes and thicknesses can be utilized for the conductive material 156 and conductive nanosheets 157 without departing from the scope of the present disclosure.

In FIG. 1K, a conductive trench fill material 158 has been deposited on the layer of conductive material 156. The conductive trench fill material 158 fills any remaining gap in the trench 150. In one example, the conductive trench fill material 158 is tungsten deposited by a CVD process, though other materials and deposition processes can be utilized for the conductive trench fill material 158 without departing from the scope of the present disclosure. The layer of conductive material 156, the conductive nanosheets 157, and the conductive trench fill material 158 collectively form a bottom electrode 160 of the resistor device 104.

In FIG. 1K, the top electrode 162 includes the first metal layer 142, the second metal layer 144, and the third metal layer 146. In other embodiments, the top electrode 162 can include a single metal or different combinations of metal layers other than the gate electrode 148 of the transistor 102.

In FIG. 1L, silicide layers 164 have been formed in the source and drain regions 130 of the transistor 102. The silicide layers 164 can include titanium silicide, cobalt silicide, or other types of silicide. In FIG. 1L, cobalt contact plugs 168 have been formed in the interlayer dielectric layer 132 in each of the transistors 102, 104, and 108. The cobalt contact plugs 168 can be utilized to apply voltages to the source and drain regions 130 of the transistor 102. The plugs 168 are surrounded by a titanium nitride glue layer 168. The plugs 168, the glue layer 168, and the silicide layers 164 can include other materials without departing from the scope of the present disclosure.

In FIG. 1M, an interlevel dielectric layer 169 has been deposited on the interlevel dielectric layer 132. The interlevel dielectric layer 169 can include silicon oxide. The interlevel dielectric layer 169 can be deposited by CVD, ALD, or other suitable processes. Other materials and processes can be utilized for the interlevel dielectric layer 169 without departing from the scope of the present disclosure.

In FIG. 1M, contact plugs 170, 172, 174, and 176 have been formed in the interlevel dielectric layer 169. The contact plugs 170 are electrical contact with the contact plugs 168 that contact the silicide 164 in the source and drain layers 130 of the transistor 102. The contact plugs 172 contacts the gate electrode 148 of the transistor 102, The contact plugs 174 contacts the conductive material 158 and is thus electrically connected to the bottom electrode 160 of the resistor device 104, The contact plugs 176 is in electrical contact with the top electrode 162 of the electrical device. Each of the contact plugs 170, 172, 174, and 176 can include tungsten or another suitable conductive material. Each of the contact plugs 170, 172, 174, and 176 can be surrounded by a respective conductive liner 171, 173, 177, and 179. The conductive liners 171, 173, 177, and 179 can include titanium nitride or another suitable material.

In FIG. 1N, an interlevel dielectric layer 181 has been deposited on the interlevel dielectric layer 169. The interlevel dielectric layer 181 can include silicon oxide. The interlevel dielectric layer 181 can be deposited by CVD, ALD, or other suitable processes. Other materials and processes can be utilized for the interlevel dielectric layer 181 without departing from the scope of the present disclosure.

In FIG. 1N, metal lines 180, 182, 184, and 186 have been formed in the interlevel dielectric layer 181. The metal lines 180, 182, 184, and 186 are conductive lines that electrically connect to the various terminals of the transistor 102 and the resistor device 104. The metal lines 180, 182, 184, and 186 can include copper or another suitable conductive material. In FIG. 1N the transistor 102 and the resistor device 104 are complete, although other subsequent dielectric and metal layers and structures may be subsequently formed in the integrated circuit as will be understood by those of skill in the art.

The transistor 102 and the resistor device 104 correspond to a RRAM memory cell 190 of a RRAM memory array. The transistor 102 corresponds to an access transistor of the memory cell 190. The resistor device 104 includes the data storage element of the memory cell 190. More particularly, the high-K gate dielectric layer 140 the resistive element in the resistor device 104 and corresponds to the data storage element of the memory cell 190. The effective resistance of the high-K dielectric layer 140 can be selectively toggled between a high resistance state and a low resistance state. Accordingly, the resistance provided by the high-K dielectric layer 140 corresponds to the value of data stored in the memory cell 190.

The high-K dielectric layer 140 can be placed in a high resistance state by performing a DC sweep operation by holding the voltage of the bottom electrode 160 and 0 V and sweeping the voltage of the top electrode 162 to −1.5 V, i.e., by performing a DC sweep that lowers the voltage of the top electrode 162 below the voltage of the bottom electrode 160. The high-K dielectric 140 of the resistor device 104 can be placed in a low resistance state by holding the voltage of the bottom electrode 160 at 0 V and sweeping the voltage of the top electrode 162 to 1.5 V, i.e., by performing a DC sweep that raises the voltage of the top electrode 162 higher than the voltage of the bottom electrode 160. Other voltage values can be applied for setting the resistor device 104 between the high resistance state and the low resistance state without departing from the scope of the present disclosure.

In one example, in the low resistance state the resistance of the resistor device 104 is between 1000 ohms and 10,000 ohms. In the high resistance state, the resistance of the resistor device 104 is between 10,000 ohms and 100,000 ohms. Thus, in one example, the resistance of the resistor device 104 changes by least an order of magnitude between the high resistance state and the low resistance state.

Data can be read from the memory cell 190 by measuring the resistance in the resistor device 104. Typically, a read operation includes turning on the transistor 102 by applying a voltage between the gate terminal 146 and the source 130, In the example of FIG. 1N, the source terminal of the transistor 102 is the left region 130. The drain terminal is the right region 130 of the transistor 102. With the transistor 102 in the conducting state, a voltage can be applied between the bottom electrode 160 and the top electrode 162 of the resistor device 104. The resistance can be measured indirectly by measuring a voltage drop across the resistor device 104 or by measuring a current flowing through the resistor device 104. Such measurements can be accomplished by current or voltage based sense amplifiers and other read circuitry coupled to the memory array of which the memory cell 190 is part.

In one embodiment, the metal interconnect 180 is a source line of the memory cell 190. The metal interconnect 180 is electrically coupled to the source of the transistor 102 via the plugs 170 and 168 on the left side of the transistor 102. In one embodiment, the metal interconnect 182 is a word One of the memory cell 190. The word One 182 is electrically connected to the gate terminal 148 of the transistor 102 via the plugs 172. In one embodiment, the metal interconnect 184 electrically connects the drain terminal of the transistor 102 to the bottom electrode 160 of the resistor device 104 via the right side plug 170 and the plug 174. In one embodiment, the metal interconnect 186 is a bit One of the memory cell 190.

Figure 2:
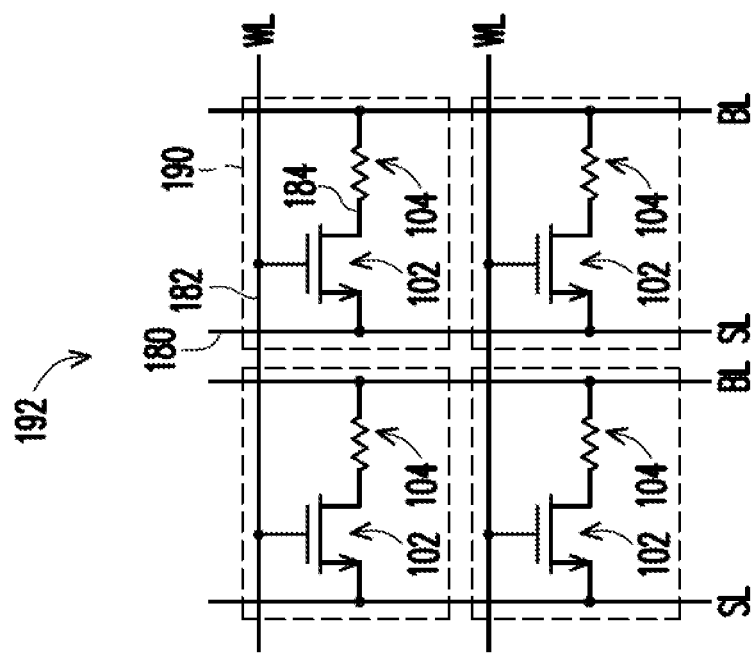
FIG. 2 is a schematic diagram of a resistive random access memory array, according to some embodiments.

FIG. 2 is a schematic diagram of a memory array 192, according to some embodiments. The memory array 192 is a RRAM memory cell including a plurality of RRAM memory cells 190, The view of FIG. 1N illustrates a single RRAM memory cell 190. Each RRAM memory cell 190 of FIG. 2 has the structure shown in FIG. 1N, in some embodiments. In particular, each RRAM memory cell 190 includes a transistor 102 and a resistor device 104. The drain of the transistor 102 is coupled to the bottom electrode of the resistor device 104. The top terminal of the resistor device 104 is coupled to a bit One (BL) 186. The gate terminal of the transistor 102 is coupled to a word line (WL) 182. The source terminal of the transistor 102 is coupled to a source One (SL) 180.

In practice, the memory array 192 may include thousands or millions of memory cells 190 arranged in rows and columns. Each row of memory cells 190 is coupled to a respective word line 182. Each column of memory cells 190 is coupled to a respective source line 180 and the bit One 186. As described in relation to FIG. 2, the resistor devices 104 are the data storage elements of the memory cells 190. Though not shown in FIG. 2, the memory array 192 may include or may be coupled to additional circuitry for writing data to the memory cells 190 and for reading data from the memory cells 190. Such additional circuitry may include row decoders, column decoders, sense amplifiers, charge pumps, read voltage regulators, clock signal generators, timing signal generators, or other circuit components that may be utilized in writing data to or reading data from the memory cells 190 of the memory array 192.

The memory array 192 of FIG. 2 illustrates memory cells 190 that include only a single transistor 102 and a single resistor device 104. This is known as a 1T1R configuration. However, other configurations are possible for the memory cells 190. For example, each memory cell 190 may include a single resistor device 104 and two or more transistors 102. These configurations are known as nT1R, where is a positive integer. In another example, each memory cell 190 may include a single transistor 102 and multiple resistor devices 104. These configurations are known as 1TmR, where m is a positive integer.

In the example of FIGS. 1N and 2, the memory array 192 is implemented in a single integrated circuit formed from a single semiconductor wafer. However, other arrangements are possible. For example, the memory array 192 may be implemented in an integrated circuit cut from two semiconductor wafers bonded together. One of the semiconductor wafers may include the transistors 102 of the memory cells 190. The other semiconductor wafer may include the resistor devices 104 of the memory cells 190. Various configurations for the memory cells 190 of the memory array 192 are possible without departing from the scope of the present disclosure.

Figure 3:
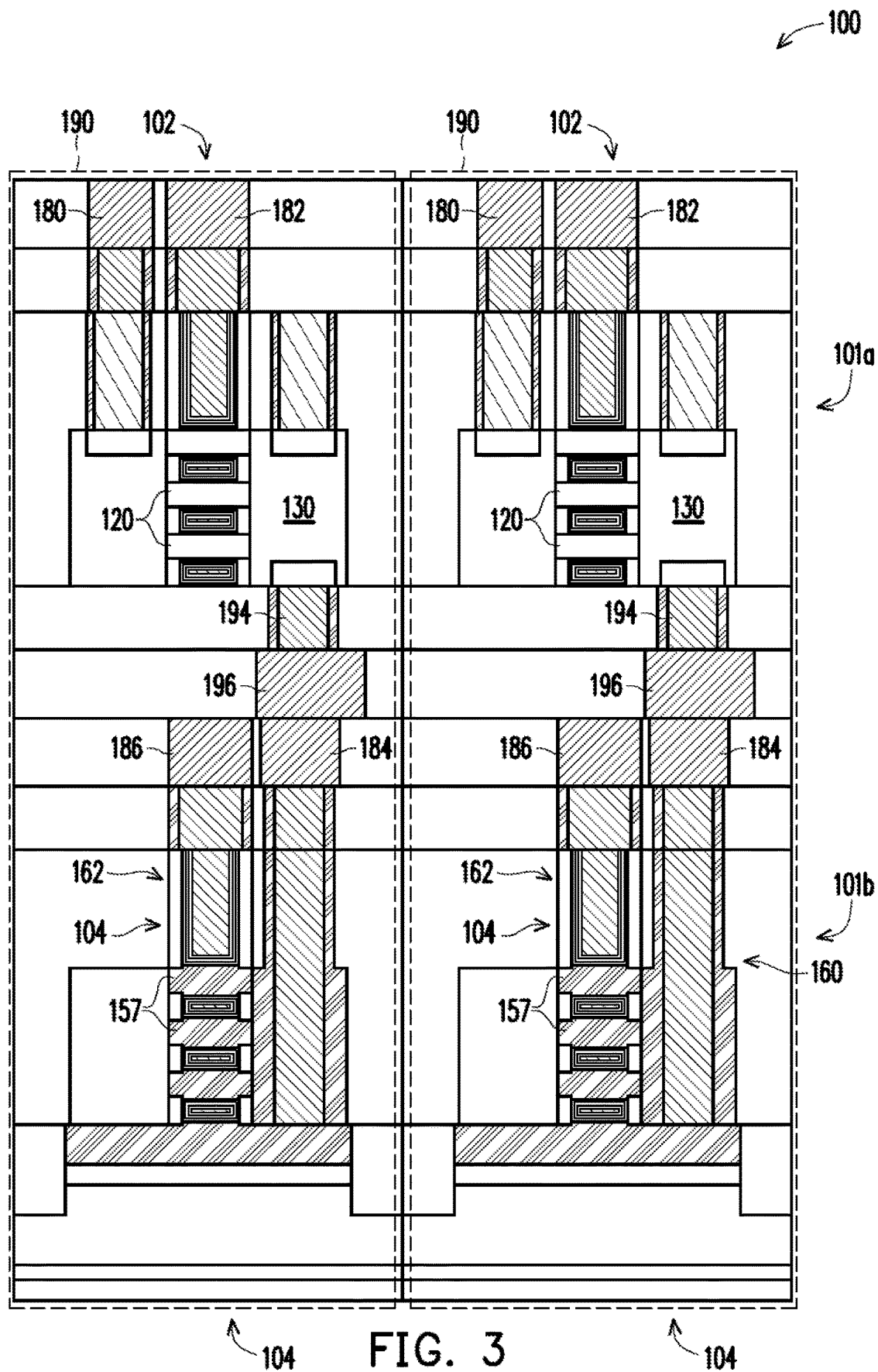
FIG. 3 is a cross-sectional view of an integrated circuit, according to some embodiments.

FIG. 3 is a cross-sectional diagram of an integrated circuit 100, according to some embodiments. The integrated circuit 100 includes a first integrated circuit die 101a and a second integrated circuit die 101b bonded together by wafer bonding techniques. In particular, the first integrated circuit die 101a is formed in a first semiconductor wafer. The second integrated circuit die 101b is formed in the second semiconductor wafer. Prior to dicing, the first semiconductor wafer is bonded to the second semiconductor wafer. After dicing, a plurality of integrated circuits 100 are formed from the bonded wafers. Each integrated circuit 100 includes a first integrated circuit die 101a and a second integrated circuit die 101b.

The integrated circuit die 101a includes a plurality of transistors 102. The transistors 102 can include the same structures and can be formed using the same or similar processes as those described for forming the transistor 102 of FIGS. 1A-2. Some differences may include forming a silicide at the bottom of the drain regions 130 of the transistors 102 and forming conductive plugs 194 at the bottom of the integrated circuit die 101a teaching contact with the drain terminal 130 of the respective transistor 102. Prior to the wafer bonding process, the bottom surface of the conductive plugs 194 are exposed on the bottom surface of the integrated circuit die 101a.

The integrated circuit die 101b includes a plurality of resistor devices 104. The resistor devices 104 can include the same structures and can be formed using the same or similar processes as those described for forming the resistor device 104 of FIGS. 1A-2. Some differences may include forming contacts 196 on top of the interconnects 184 in the second integrated circuit die 101b. The top surfaces of the contacts 196 are exposed at the top surface of the integrated circuit die 101b prior to the wafer bonding process. The wafer bonding process brings each contact 196 into electrical contact with a respective conductive plug 194. In this way, the drain terminal of each transistor 102 are coupled to the bottom electrode of a respective resistor device 104.

In one embodiment, each RRA M memory cell 190 includes a transistor 102 from the first integrated circuit die 101a and a resistor device 104 from the second integrated circuit die 101b. While two memory cells 190 are illustrated in FIG. 100, in practice, the integrated circuit 100 may include thousands or millions of memory cells 190.

Figure 4:
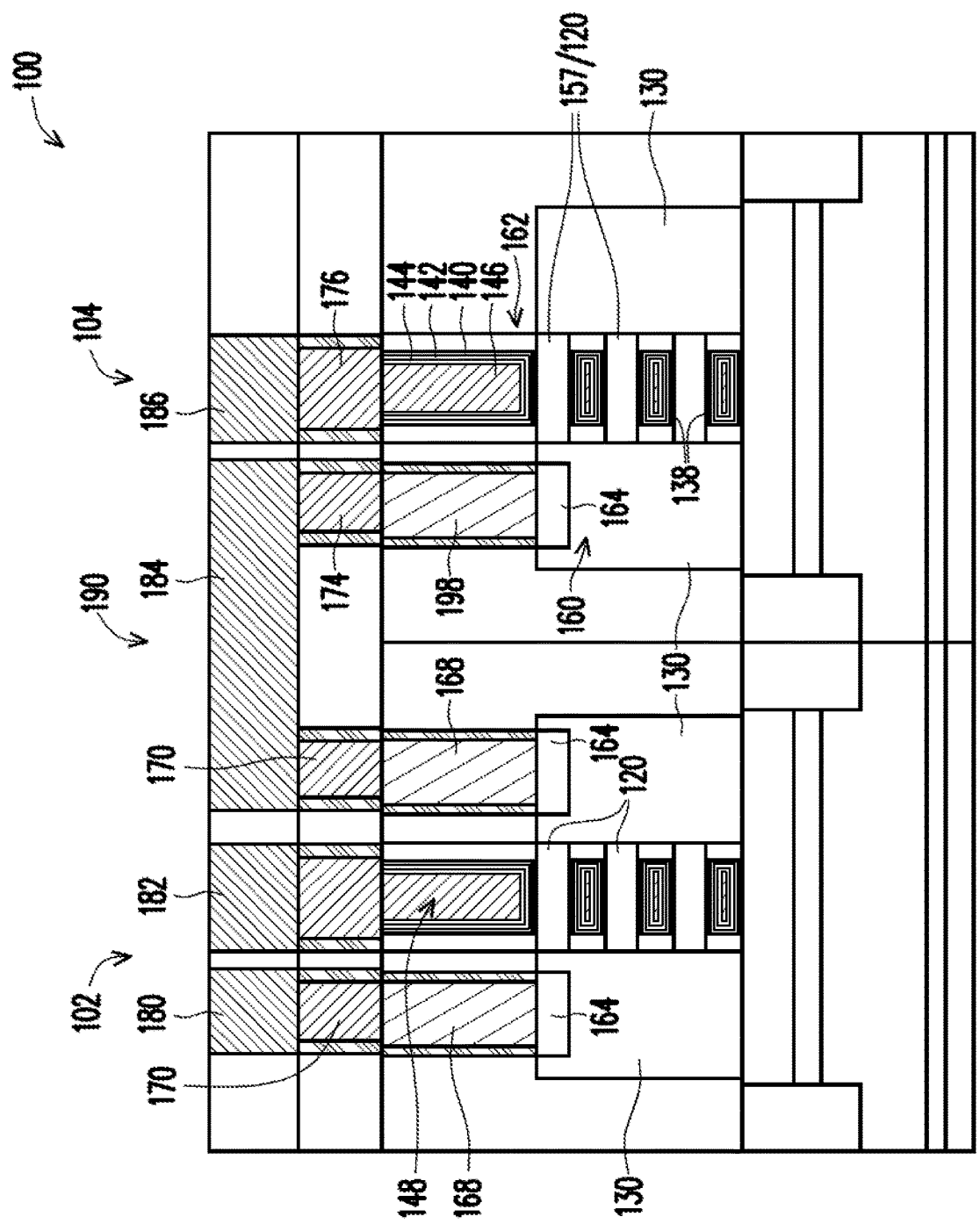
FIG. 4 is a cross-sectional view of an integrated circuit, according to some embodiments.

FIG. 4 is a cross-section of integrated circuit 100, according to some embodiments. The integrated circuit 100 includes an RRAM memory cell 190. The memory cell 190 includes a transistor 102 and a resistor device 104. The transistor 102 of FIG. 4 may be identical or substantially identical to the transistor 102 described in relation to FIGS. 1A-2. The resistor device 104 of FIG. 4 is similar to the resistor device 104 of FIGS. 1A-2, except that the left source region 130 and the semiconductor nanosheets 120 of the resistor device 104 are not replaced with the conductive materials 156 and 158. Instead, the left source/drain region 130 and the semiconductor nanosheets 120 of the resistor device 104 correspond to the bottom electrode 160 of the resistor device 104.

The semiconductor nanosheets 120 of the resistor device 104 are highly doped compared to the semiconductor nanosheets 120 of the transistor 102. This renders the semiconductor nanosheets 120 of the resistor device 104 highly conductive compared to the semiconductor nanosheets 120 of the transistor 102. Accordingly, the semiconductor nanosheets 120 of the resistor device 104 are conductive nanosheets 157. In one example, the semiconductor nanosheets 120 of the resistor device 104 are heavily doped with P-type dopants. The P-type dopants may include boron or other P-type dopants. In another example, the semiconductor nanosheets 120 of the resistor device 104 heavily doped with N-type dopants. The N-type dopants can include phosphorus or other N-type dopants. The doping of the semiconductor nanosheets 120 of the resistor device 104 can occur during formation of the semiconductor nanosheets 120 of the resistor device 104.

In one example, aside from the different doping of the semiconductor nanosheets 120 of the resistor device 104 with respect to the semiconductor nanosheets 120 of the transistor 102, the process for forming the resistor device 104 of FIG. 3 differs from formation of the resistor device 104 of FIGS. 1A-2 beginning at the stage of processing shown in FIGS. 1G and 1H. In particular, the steps shown in FIGS. 1H-1K do not take place in the formation of the resistor device 104 of FIG. 4. Instead, silicide 164 is formed in the left source/drain region 130 of the resistor device 104 as described in relation to the silicide 164 formed in the transistor 102. The formation of the silicides may occur in the same processing steps. Conductive plug 198 can be formed at the same time as conductive plugs 160 may be formed in the same material. The processing steps for forming conductive plugs 170, 172, 174, and 176 and interconnects 180, 182, 184 and 186 may be substantially the same as described in relation to FIGS. 1 and 1N.

Another difference between the resistor device 104 of FIG. 4 and the resistor device 104 of FIG. 1N is that the interfacial dielectric layer 138 is still present in the resistor device 104 of FIG. 4. Another possible difference is that the top electrode 162 of the resistor device 104 of FIG. 4 can include a single conductive layer rather than the various metal layer layers that are included in the gate electrode of the transistor device 102.

Figure 5:
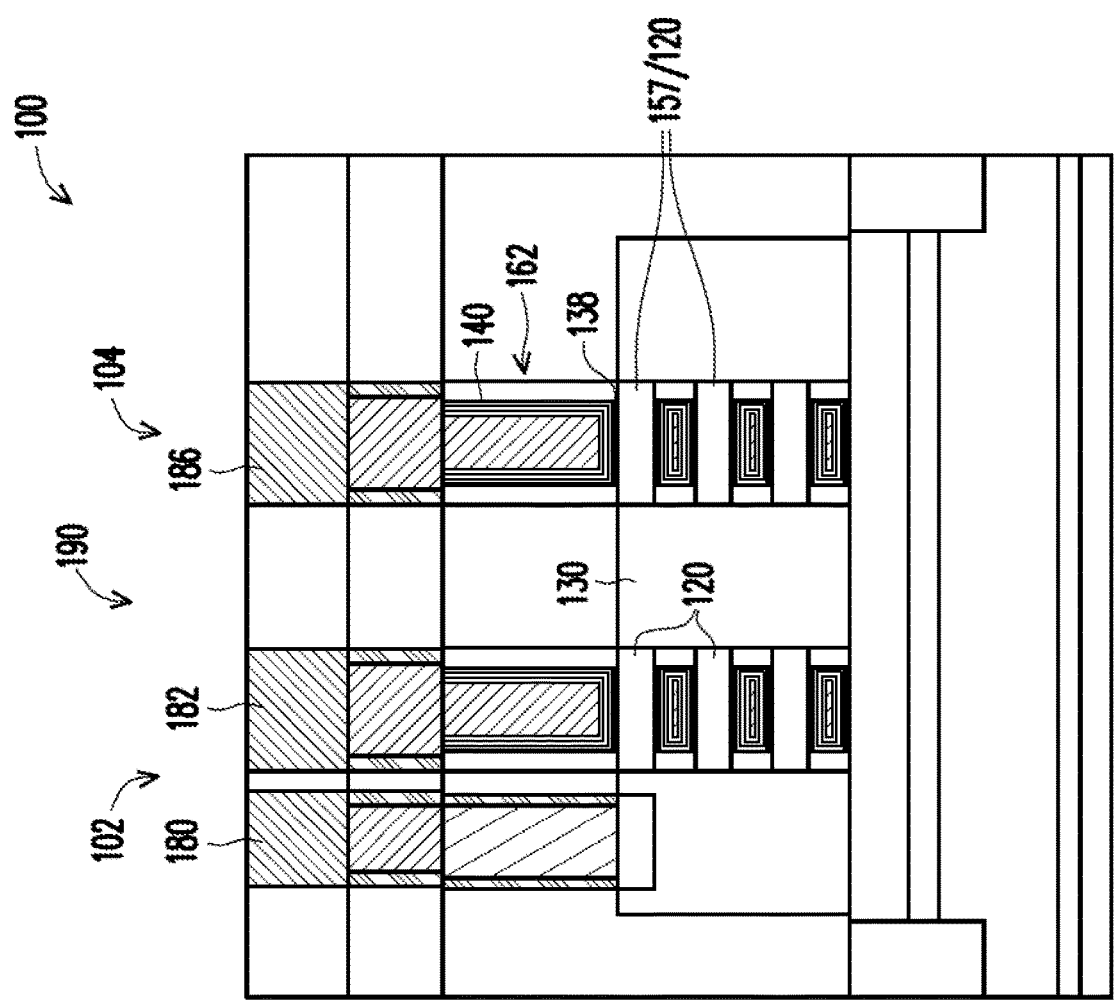
FIG. 5 is a cross-sectional view of an integrated circuit, according to some embodiments.

FIG. 5 is a cross-sectional view of an integrated circuit 100, according to some embodiments. The integrated circuit 100 includes a RRAM memory cell 190. The memory cell 190 includes a transistor 102 and a resistor device 104. The transistor 102 and the resistor device 104 are substantially similar to the transistor 102 and the resistor device 104 of FIG. 3, except that the drain region 130 of the transistor 102 is shared with the resistor device 104. Accordingly, when the current is passed through the memory cell 190, a voltage is applied to the gate electrode of the transistor 102 in order to render the semiconductor nanosheets 120 of the transistor 102 conductive. A voltage is applied between the top electrode 162 of the resistor device 104 and the source region 130 (left region 130) of the transistor 102. Current flows from the top electrode 162 through the resistive element including the interfacial dielectric layer 138 and the high-K dielectric layer 140 of the resistor device 104 into the highly doped semiconductor nanosheets of the resistor device 104 through the shared drain region 130, through the semiconductor nanosheets 120 of the transistor 102 to the source region 130 of the transistor 102 and through the source line 180.

Figure 6A:
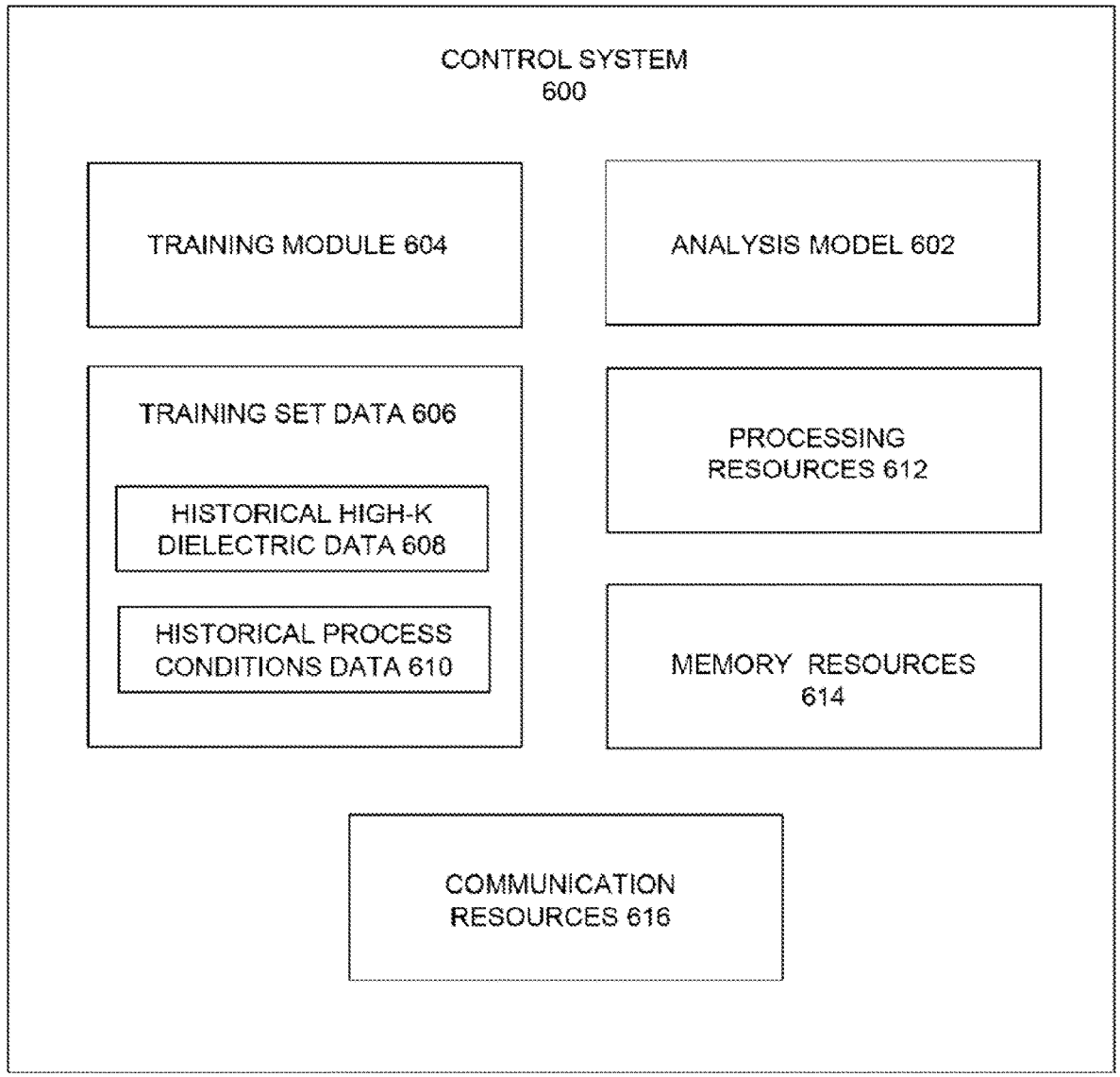
FIG. 6A is a block diagram of a control system of a semiconductor process system, according to some embodiments.

FIG. 6A is a block diagram of a control system 600 for controlling an atomic layer etching (ALE) process, according to some embodiments. The control system 600 of FIG. 6A is configured to control operation of an ALE etching system in performing ALE processes to form aspects of the integrated circuits 100 of FIGS. 1A-5, according to some embodiments.

In some embodiments, the control system 600 is used to control an ALE process for forming the high-K dielectric layer 140 described in relation to FIG. 1G. As described previously, the high-K dielectric layer 140 of the resistor device 104 is utilized as a resistor element of the resistor device 104. The high-K dielectric layer 140 of the transistor 102 is part of the gate dielectric of the transistor 104. Because the high-K dielectric layer 140 performs different functions in the transistor 102 and the resistor 104, in some embodiments there are subtle differences in the high-K dielectric layer 140 of the resistor device 104 vs the transistor 102. In particular, the high-K dielectric layer 140 may be thinner or thicker in the resistor device 104 vs the transistor 102. Because this layer is already very thin, the control system 600 is utilized to carefully reduce the thickness of the high-K dielectric layer 140 in either the transistor 102 or the resistor device 104 without entirely removing the high-K dielectric layer 140 via an ALE process.

As described previously in relation to FIG. 1G, the high-K gate dielectric layer 140 may include a first sub-layer that includes HfO2 with dipole doping including La and Mg, and a second sub-layer including a higher-K ZrO layer with crystallization. In particular, the first sub-layer may include a primarily amorphous structure while the second sub-layer may include a primarily crystalline structure. In one embodiment, the first layer is between 0.5 nm and 2 nm in thickness. In one embodiment, the second layer is between 0.5 nm and 2 nm in thickness. In one embodiment, the high-K gate dielectric layer 140 of the resistor device 104 may include only the first or second sub-layer whereas the high-K dielectric layer 140 of the transistor 102 may include both the first and second sub-layers. In one example, after deposition of the first and second sub-layers of the high-K dielectric layer 140, the second sub-layer may be removed from the resistor device 104. This can be accomplished by masking the region of the transistor 102 and performing, under the control of the control system 600, a controlled ALE process at the exposed high-K gate dielectric layer 140 of the resistor device 104. The ALE process removes the second sub-layer of the high-K dielectric layer 140 at the resistor device 104 without removing the first sub-layer of the high-K dielectric layer 140 of the resistor device 104.

In one embodiment, because the sub-layers of the high-K dielectric layer 140 are very thin, a tightly controlled atomic layer etching (ALE) process is performed to remove the second sub-layer of the high-K dielectric layer 140 at the resistor device 104. The ALE process is able, to remove a single atomic or molecular layer of the second sub-layer in each ALE cycle. The number and duration of each cycle can be selected by the control system 600 to remove the second sub-layer without removing the first sub-layer.

Figure 6B:
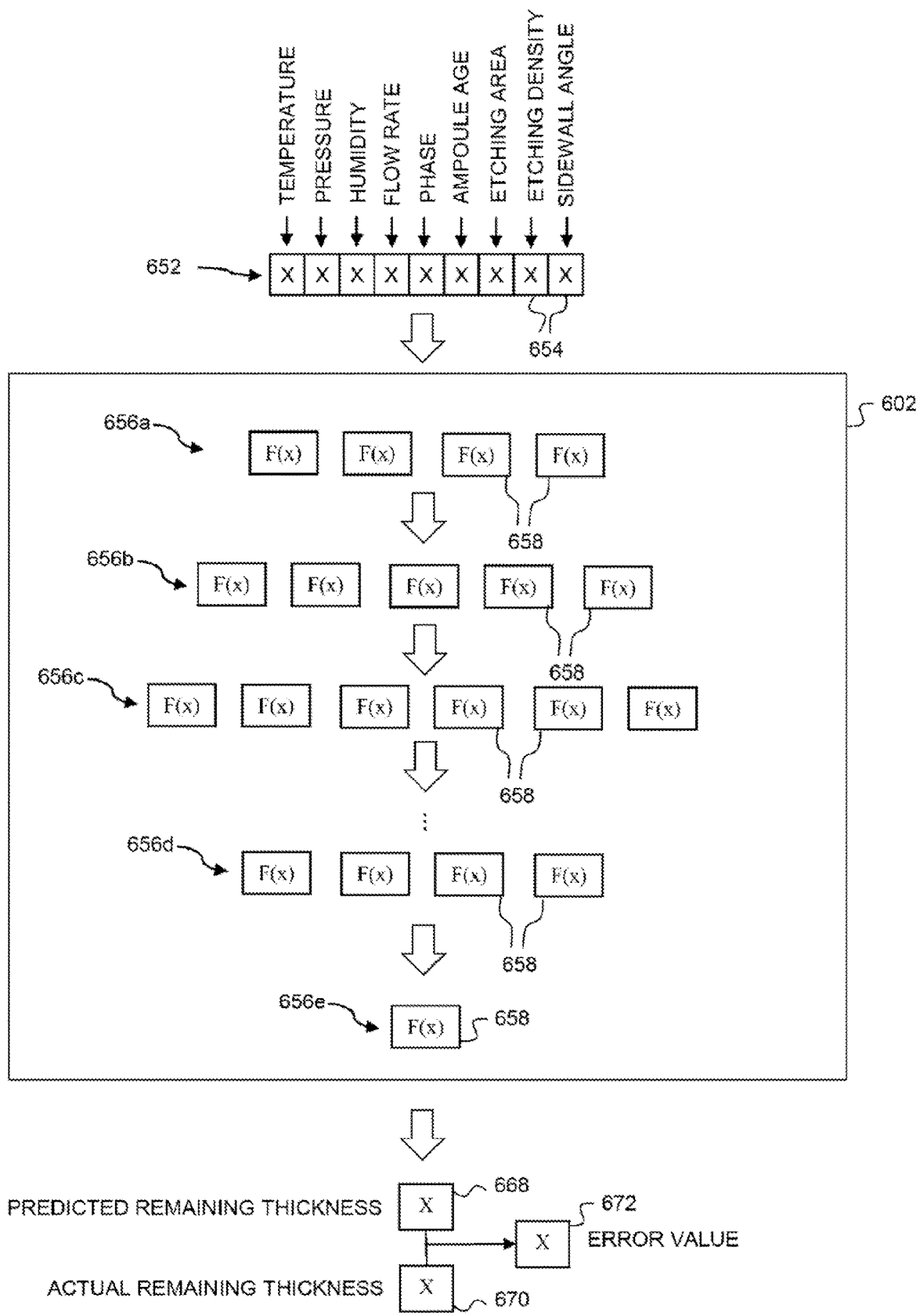
FIG. 6B is a block diagram of an analysis model, according to some embodiments.

While the description of FIGS. 6A and 6B is directed primarily to controlled etching of the high-K dielectric layer 140, the controlled etching can also be used to pattern other thin-films. For example, the controlled ALE process can be used to pattern the various metal layers of the gate electrode 148 of the transistor 102 and the top electrode 162 of the resistor device 104.

The control system 600 utilizes machine learning to adjust parameters of the ALE system. The control system 600 can adjust parameters of the ALE system between ALE runs or even between ALE cycles in order to ensure that the high-K dielectric layer 140 of the resistor device 104 falls within selected specifications.

In one embodiment, the control system 600 includes an analysis model 602 and a training module 604. The training module trains the analysis model 602 with a machine learning process. The machine learning process trains the analysis model 602 to select parameters for an ALE process that will result in the high-K dielectric layer 140 of the resistor device 104 having selected characteristics. Although the training module 604 is shown as being separate from the analysis model 602, in practice, the training module 604 may be part of the analysis model 602.

The control system 600 includes, or stores, training set data 606. The training set data 606 includes historical high-K dielectric data 608 and historical process conditions data 610. The historical high-K dielectric data 608 includes data related to high-K dielectric layers resulting from ALE processes. The historical process conditions data 610 includes data related to process conditions during the ALE processes that etched the high-K dielectric layers. As will be set forth in more detail below, the training module 604 utilizes the historical high-K dielectric data 608 and the historical process conditions data 610 to train the analysis model 602 with a machine learning process.

In one embodiment, the historical high-K dielectric data 608 includes data related to the remaining thickness of previously etched high-K dielectric layers. For example, during operation of a semiconductor fabrication facility, thousands or millions of semiconductor wafers may be processed over the course of several months or years. Each of the semiconductor wafers may include high-K dielectric layers etched by ALE processes. After each ALE process, the thicknesses of the thin-films are measured as part of a quality control process. The historical high-K dielectric data 608 includes the remaining thicknesses of each of the high-K dielectric layers etched by ALE processes. Accordingly, the historical high-K dielectric data 608 can include thickness data for a large number of thin-films etched by ALE processes.

In one embodiment, the historical high-K dielectric data 608 may also include data related to the thickness of high-K dielectric layers at intermediate stages of the thin-film etching processes. For example, an ALE process may include a large number of etching cycles during which individual layers of the high-K dielectric layer are etched. The historical high-K dielectric data 608 can include thickness data for high-K dielectric layers after individual etching cycles or groups of etching cycles. Thus, the historical high-K dielectric data 608 not only includes data related to the total thickness of a high-K dielectric layer after completion of an ALE process, but may also include data related to the thickness of the high-K dielectric layer at various stages of the ALE process.

In one embodiment, the historical high-K dielectric data 608 includes data related to the composition of the remaining high-K dielectric layers etched by ALE processes. After a high-K dielectric layer is etched, measurements can be made to determine the elemental or molecular composition of the high-K dielectric layers. Successful etching of the high-K dielectric layers results in a high-K dielectric layer that includes particular remaining thicknesses. Unsuccessful etching processes may result in a high-K dielectric layer that does not include the specified proportions of elements or compounds. The historical high-K dielectric data 608 can include data from measurements indicating the elements or compounds that make up the various high-K dielectric layers.

In one embodiment, the historical process conditions 610 include various process conditions or parameters during ALE processes that etch the high-K dielectric layers associated with the historical high-K dielectric data 608. Accordingly, for each high-K dielectric layer having data in the historical high-K dielectric data 608, the historical process conditions data 610 can include the process conditions or parameters that were present during etching of the high-K dielectric layer. For example, the historical process conditions data 610 can include data related to the pressure, temperature, and fluid flow rates within the process chamber during ALE processes.

The historical process conditions data 610 can include data related to remaining amounts of precursor material in the fluid sources during ALE processes. The historical process conditions data 610 can include data related to the age of the ALE etching chamber, the number of etching processes that have been performed in the ALE etching chamber, a number of etching processes that have been performed in the ALE etching chamber since the most recent cleaning cycle of the ALE etching chamber, or other data related to the ALE etching chamber. The historical process conditions data 610 can include data related to compounds or fluids introduced into the ALE etching chamber during the etching process. The data related to the compounds can include types of compounds, phases of compounds (solid, gas, or liquid), mixtures of compounds, or other aspects related to compounds or fluids introduced into the ALE etching chamber. The historical process conditions data 610 can include data related to the humidity within the ALE etching chamber during ALE processes. The historical process conditions data 610 can include data related to light absorption, light adsorption, and light reflection related to the ALE etching chamber. The historical process conditions data 626 can include data related to the length of pipes, tubes, or conduits that carry compounds or fluids into the ALE etching chamber during ALE processes. The historical process conditions data 610 can include data related to the condition of carrier gases that carry compounds or fluids into the ALE etching chamber during ALE processes.

In one embodiment, historical process conditions data 610 can include process conditions for each of a plurality of individual cycles of a single ALE process. Accordingly, the historical process conditions data 610 can include process conditions data for a very large number of ALE cycles.

In one embodiment, the training set data 606 links the historical high-K dielectric data 608 with the historical process conditions data 610. In other words, the thin-film thickness, material composition, or crystal structure associated with a high-K dielectric layer in the historical high-K dielectric data 608 is linked to the process conditions data associated with that etching process. As will be set forth in more detail below, the labeled training set data can be utilized in a machine learning process to train the analysis model 602 to predict semiconductor process conditions that will result in properly formed high-K dielectric layers.

In one embodiment, the control system 624 includes processing resources 612, memory resources 614, and communication resources 616. The processing resources 612 can include one or more controllers or processors. The processing resources 612 are configured to execute software instructions, process data, make thin-film etching control decisions, perform signal processing, read data from memory, write data to memory, and to perform other processing operations. The processing resources 612 can include physical processing resources 612 located at a site or facility of the ALE system. The processing resources can include virtual processing resources 612 remote from the site ALE system or a facility at which the ALE system is located. The processing resources 612 can include cloud-based processing resources including processors and servers accessed via one or more cloud computing platforms.

In one embodiment, the memory resources 614 can include one or more computer readable memories. The memory resources 614 are configured to store software instructions associated with the function of the control system and its components, including, but not limited to, the analysis model 602. The memory resources 614 can store data associated with the function of the control system 600 and its components. The data can include the training set data 606, current process conditions data, and any other data associated with the operation of the control system 600 or any of its components. The memory resources 614 can include physical memory resources located at the site or facility of the ALE system. The memory resources can include virtual memory resources located remotely from site or facility of the ALE system. The memory resources 614 can include cloud-based memory resources accessed via one or more cloud computing platforms.

In one embodiment, the communication resources can include resources that enable the control system 600 to communicate with equipment associated with the ALE system. For example, the communication resources 616 can include wired and wireless communication resources that enable the control system 600 to receive the sensor data associated with the ALE system and to control equipment of the ALE system. The communication resources 616 can enable the control system 600 to control the flow of fluids or other material from the fluid sources 608 and 610 and from the purge sources 612 and 614. The communication resources 616 can enable the control system 600 to control heaters, voltage sources, valves, exhaust channels, wafer transfer equipment, and any other equipment associated with the ALE system. The communication resources 616 can enable the control system 600 to communicate with remote systems. The communication resources 616 can include, or can facilitate communication via, one or more networks such as wire networks, wireless networks, the Internet, or an intranet. The communication resources 616 can enable components of the control system 600 to communicate with each other.

In one embodiment, the analysis model 602 is implemented via the processing resources 612, the memory resources 614, and the communication resources 616. The control system 600 can be a dispersed control system with components and resources and locations remote from each other and from the ALE system.

FIG. 6B is a block diagram illustrating operational aspects and training aspects of the analysis model 602 of FIG. 6A, according to some embodiments. The analysis model 602 can be used to select parameters for ALE processes performed by the ALE system to form aspects the integrated circuits 100 of FIGS. 1A-4. In some embodiments, the analysis model 602 of FIG. 6B is used to control an ALE process for forming the high-K dielectric layer 140 described in relation to FIG. 1G.

While the description of the analysis model 602 is directed primarily to forming or patterning the high-K dielectric layer 140, the analysis model 602 can be utilized to pattern other materials of the transistor 102 or the resistor device 104. For example, the analysis model 602 can control an ALE process for forming or patterning the metal layers associated with the gate electrode 148 and the top electrode 162.

As described previously, the training set data 606 includes data related to a plurality of previously performed high-K dielectric layer etching processes. Each previously performed high-K dielectric layer etching process took place with particular process conditions and resulted in a high-K dielectric layer having a particular characteristics. The process conditions for each previously performed high-K dielectric layer etching process are formatted into a respective process conditions vector 652. The process conditions vector includes a plurality of data fields 654. Each data field 654 corresponds to a particular process condition.

The example of FIG. 6B illustrates a single process conditions vector 652 that will be passed to the analysis model 602 during the training process. In the example of FIG. 6B, the process conditions vector 652 includes nine data fields 654. A first data field 654 corresponds to the temperature during the previously performed high-K dielectric layer etching process. A second data field 656 corresponds to the pressure during the previously performed high-K dielectric layer etching process. A third data field 654 corresponds to the humidity during the previously performed high-K dielectric layer etching process. The fourth data field 654 corresponds to the flow rate of etching materials during the previously performed high-K dielectric layer etching process. The fifth data field 654 corresponds to the phase (liquid, solid, or gas) of etching materials during the previously performed high-K dielectric layer etching process. The sixth data field 654 corresponds to the age of the ampoule used in the previously performed high-K dielectric layer etching process. The seventh data field 654 corresponds to a size of an etching area on a wafer during the previously performed high-K dielectric layer etching process. The eighth data field 654 corresponds to the density of surface features of the wafer utilized during the previously performed high-K dielectric layer etching process. The ninth data field corresponds to the angle of sidewalls of surface features during the previously performed high-K dielectric layer etching process. In practice, each process conditions vector 652 can include more or fewer data fields than are shown in FIG. 6B without departing from the scope of the present disclosure. Each process conditions vector 652 can include different types of process conditions without departing from the scope of the present disclosure. The particular process conditions illustrated in FIG. 6B are given only by way of example. Each process condition is represented by a numerical value in the corresponding data field 654. For condition types that are not naturally represented in numbers, such as material phase, a number can be assigned to each possible phase.

The analysis model 602 includes a plurality of neural layers 656a-e. Each neural layer includes a plurality of nodes 658. Each node 658 can also be called a neuron. Each node 658 from the first neural layer 656a receives the data values for each data field from the process conditions vector 652. Accordingly, in the example of FIG. 6B, each node 658 from the first neural layer 656a receives nine data values because the process conditions vector 652 has nine data fields. Each neuron 658 includes a respective internal mathematical function labeled F(x) in FIG. 6B. Each node 658 of the first neural layer 656a generates a scalar value by applying the internal mathematical function F(x) to the data values from the data fields 654 of the process conditions vector 652. Further details regarding the internal mathematical functions F(x) are provided below.

Each node 658 of the second neural layer 656b receives the scalar values generated by each node 658 of the first neural layer 656a. Accordingly, in the example of FIG. 6B each node of the second neural layer 656b receives four scalar values because there are four nodes 658 in the first neural layer 656a. Each node 658 of the second neural layer 656b generates a scalar value by applying the respective internal mathematical function F(x) to the scalar values from the first neural layer 656a.

Each node 658 of the third neural layer 656c receives the scalar values generated by each node 658 of the second neural layer 656b. Accordingly, in the example of FIG. 6B each node of the third neural layer 656c receives five scalar values because there are five nodes 658 in the second neural layer 656b. Each node 658 of the third neural layer 656c generates a scalar value by applying the respective internal mathematical function F(x) to the scalar values from the nodes 658 of the second neural layer 656b.

Each node 658 of the neural layer 656d receives the scalar values generated by each node 658 of the previous neural layer (not shown). Each node 658 of the neural layer 656d generates a scalar value by applying the respective internal mathematical function F(x) to the scalar values from the nodes 658 of the second neural layer 656b.

The final neural layer includes only a single node 658. The final neural layer receives the scalar values generated by each node 658 of the previous neural layer 656d. The node 658 of the final neural layer 656e generates a data value 668 by applying a mathematical function F(x) to the scalar values received from the nodes 658 of the neural layer 656d.

In the example of FIG. 6B, the data value 668 corresponds to the predicted remaining thickness of a high-K dielectric layer generated by process conditions data corresponding to values included in the process conditions vector 652. In other embodiments, the final neural layer 656e may generate multiple data values each corresponding to a particular high-K dielectric layer characteristic such as high-K dielectric layer crystal orientation, high-K dielectric layer uniformity, or other characteristics of a high-K dielectric layer. The final neural layer 656e will include a respective node 658 for each output data value to be generated. In the case of a predicted high-K dielectric layer thickness, engineers can provide constraints that specify that the predicted high-K dielectric layer thickness 668 must fall within a selected range, such as between 0 nm and 50 nm, in one example. The analysis model 602 will adjust internal functions F(x) to ensure that the data value 668 corresponding to the predicted high-K dielectric layer thickness will fall within the specified range.

During the machine learning process, the analysis model compares the predicted remaining thickness in the data value 668 to the actual remaining thickness of the high-K dielectric layer as indicated by the data value 670. As set forth previously, the training set data 606 includes, for each set of historical process conditions data, high-K dielectric layer characteristics data indicating the characteristics of the high-K dielectric layer that resulted from the historical high-K dielectric layer etching process. Accordingly, the data field 670 includes the actual remaining thickness of the high-K dielectric layer that resulted from the etching process reflected in the process conditions vector 652. The analysis model 602 compares the predicted remaining thickness from the data value 668 to the actual remaining thickness from the data value 670. The analysis model 602 generates an error value 672 indicating the error or difference between the predicted remaining thickness from the data value 668 and the actual remaining thickness from the data value 670. The error value 672 is utilized to train the analysis model 602.

The training of the analysis model 602 can be more fully understood by discussing the internal mathematical functions F(x). While all of the nodes 658 are labeled with an internal mathematical function F(x), the mathematical function F(x) of each node is unique. In one example, each internal mathematical function has the following form:

$$F(x) = x_1 * w_1 + x_2 * w_2 + \ldots x_n * w_1 + b.$$

In the equation above, each value $x_1$-$x_n$ corresponds to a data value received from a node 658 in the previous neural layer, or, in the case of the first neural layer 656a, each value $x_1$-$x_n$ corresponds to a respective data value from the data fields 654 of the process conditions vector 652. Accordingly, n for a given node is equal to the number of nodes in the previous neural layer. The values $w_1$-$w_n$ are scalar weighting values associated with a corresponding node from the previous layer. The analysis model 602 selects the values of the weighting values $w_1$-$w_n$. The constant b is a scalar biasing value and may also be multiplied by a weighting value. The value generated by a node 658 is based on the weighting values $w_1$-$w_n$. Accordingly, each node 658 has n weighting values $w_i$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 672 has been calculated, the analysis model 602 adjusts the weighting values $w_1$-$w_n$ for the various nodes 658 of the various neural layers 656a-356e. After the analysis model 602 adjusts the weighting values $w_1$-$w_n$, the analysis model 602 again provides the process conditions vector 652 to the input neural layer 656a. Because the weighting values are different for the various nodes 658 of the analysis model 602, the predicted remaining thickness 668 will be different than in the previous iteration. The analysis model 602 again generates an error value 672 by comparing the actual remaining thickness 670 to the predicted remaining thickness 668.

The analysis model 602 again adjusts the weighting values $w_1$-$w_n$ associated with the various nodes 658. The analysis model 602 again processes the process conditions vector 652 and generates a predicted remaining thickness 668 and associated error value 672. The training process includes adjusting the weighting values $w_1$-$w_n$ in iterations until the error value 672 is minimized.

FIG. 6B illustrates a single process conditions vector 652 being passed to the analysis model 602. In practice, the training process includes passing a large number of process conditions vectors 652 through the analysis model 602, generating a predicted remaining thickness 668 for each process conditions vector 652, and generating associated error value 672 for each predicted remaining thickness. The training process can also include generating an aggregated error value indicating the average error for all the predicted remaining thicknesses for a batch of process conditions vectors 652. The analysis model 602 adjusts the weighting values $w_1$-$w_n$ after processing each batch of process conditions vectors 652. The training process continues until the average error across all process conditions vectors 652 is less than a selected threshold tolerance. When the average error is less than the selected threshold tolerance, the analysis model 602 training is complete and the analysis model is trained to accurately predict the thickness of high-K dielectric layers based on the process conditions. The analysis model 602 can then be used to predict high-K dielectric layer thicknesses and to select process conditions that will result in a desired high-K dielectric layer thickness. During use of the trained model 602, a process conditions vector, representing current process condition for a current high-K dielectric layer etching process to be performed, and having the same format at the process conditions vector 652, is provided to the trained analysis model 602. The trained analysis model 602 can then predict the thickness of a high-K dielectric layer that will result from those process conditions.

A particular example of a neural network based analysis model 602 has been described in relation to FIG. 6B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

In one embodiment, an integrated circuit includes a resistive random access memory cell. The resistive random access memory cell includes a gate all around transistor and a resistor device coupled to the gate all around transistor. The resistor device includes a first electrode including a plurality of conductive nanosheets, a resistive element surrounding the conductive nanosheets, and a second electrode separated from the nanosheets by the resistive element.

In one embodiment, a method includes forming a gate all around transistor of a resistive random access memory cell and forming a resistor device of the resistive random access memory cell. Forming the resistor device includes forming a bottom electrode of the resistor device including a plurality of conductive nanosheets, forming a resistive element of the resistive random access memory cell at least partially surrounding the conductive nanosheets, and forming a top electrode of the resistor device separated from the conductive nanosheets by the high-K dielectric layer.

In one embodiment, an integrated circuit includes a gate all around transistor of a resistive random access memory cell including first semiconductor nanosheets corresponding to channel regions of the gate all around transistor, a high-K gate dielectric layer surrounding the first semiconductor nanosheets, and a gate electrode separated from the first semiconductor nanosheets by the high-K gate dielectric layer. The integrated circuit includes a resistor device including a first electrode including a plurality of conductive nanosheets, a resistive element at least partially surrounding the conductive nanosheets and corresponding to a data storage element of the resistive random access memory cell, and a second electrode separated from the first electrode by the resistive element.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An integrated circuit, comprising:
 a resistive random access memory cell including:
  a gate all around transistor; and
  a resistor device coupled to the gate all around transistor and including:
   a first electrode including a plurality of conductive nanosheets;
   a resistive element at least partially surrounding the conductive nanosheets; and
   a second electrode separated from the conductive nanosheets by the resistive element.

2. The integrated circuit of claim 1, wherein the conductive nanosheets each have a thickness less than 7 nm.

3. The integrated circuit of claim 1, wherein the conductive nanosheets are metal.

4. The integrated circuit of claim 1, wherein the conductive nanosheets include titanium nitride.

5. The integrated circuit of claim 4, wherein the second electrode includes titanium nitride.

6. The integrated circuit of claim 1, wherein the conductive nanosheets are semiconductor nanosheets.

7. The integrated circuit of claim 1, wherein the gate all around transistor includes:
 a channel region including a plurality of semiconductor nanosheets;
 a high-K gate dielectric surrounding the semiconductor nanosheets; and
 a gate metal separated from the semiconductor nanosheets by the high-K gate dielectric.

8. The integrated circuit of claim 7, wherein the high-K gate dielectric layer and the resistive element include hafnium oxide.

9. A method, comprising:
 forming a gate all around transistor of a resistive random access memory cell; and
 forming a resistor device of the resistive random access memory cell, including:
  forming a bottom electrode of the resistor device including a plurality of conductive nanosheets;
  forming a resistive element of the resistive random access memory cell at least partially surrounding the conductive nanosheets; and
  forming a top electrode of the resistor device separated from the conductive nanosheets by the resistive element.

10. The method of claim 9, wherein forming the gate all around transistor includes forming a plurality of first semiconductor nanosheets as channel regions of the gate all around transistor.

11. The method of claim 10, wherein the conductive nanosheets are second semiconductor nanosheets, wherein forming the second semiconductor nanosheets includes doping the second semiconductor nanosheets with a higher dopant concentration than the first semiconductor nanosheets.

12. The method of claim 9, further comprising:
 forming the conductive nanosheets, including:
  forming a plurality of semiconductor nanosheets;
  forming voids by etching the plurality of semiconductor nanosheets; and
  forming the conductive nanosheets in the voids.

13. The method of claim 12, further comprising forming the high-K dielectric layer prior to etching the plurality of semiconductor nanosheets.

14. The method of claim 9, further comprising forming the gate all around transistor and the resistor device in a same integrated circuit die.

15. The method of claim 9, further comprising:
 forming the gate all around transistor in a first integrated circuit die;
 forming the resistor device in a second integrated circuit die; and
 bonding the first and second integrated circuit dice in a wafer bonding process.

16. An integrated circuit, comprising:
 a gate all around transistor of a resistive random access memory cell, the gate all around transistor including:
  first semiconductor nanosheets;
  a high-K gate dielectric layer at least partially surrounding the first semiconductor nanosheets; and
  a gate electrode separated from the first semiconductor nanosheets by the high-K gate dielectric layer;
 a resistor device including:
  a first electrode including a plurality of conductive nanosheets;
  a resistive element at least partially surrounding the conductive nanosheets and corresponding to a data storage element of the resistive random access memory cell; and
  a second electrode separated from the first electrode by the resistive element.

17. The integrated circuit of claim 16, wherein the gate electrode includes a plurality of metal layers, wherein the top electrode also includes the plurality of metal layers.

18. The integrated circuit of claim 16, wherein the resistive element is a same material as the high-K gate dielectric.

19. The integrated circuit of claim 16, wherein the conductive nanosheets are second semiconductor nanosheets of a same material as the first semiconductor nanosheets but with a higher dopant concentration than the first semiconductor nanosheets.

20. The integrated circuit of claim 16, wherein the resistive element and the high-K gate dielectric both include hafnium oxide, wherein the resistive element is thinner than the high-K gate dielectric.

* * * * *